United States Patent
Sato et al.

(10) Patent No.: US 6,436,741 B2
(45) Date of Patent: Aug. 20, 2002

(54) SEMICONDUCTOR INTEGRATED CIRCUIT DEVICE

(75) Inventors: Masayuki Sato, Takasaki; Kunio Uchiyama, Kodaira, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/822,429

(22) Filed: Apr. 2, 2001

Related U.S. Application Data

(62) Division of application No. 09/803,030, filed on Mar. 12, 2001.

(30) Foreign Application Priority Data

Mar. 10, 2000 (JP) ......................................... 2000-066335
Nov. 30, 2000 (JP) ......................................... 2000-364005

(51) Int. Cl.[7] ........................... H01L 21/00; H01L 21/84
(52) U.S. Cl. ......................... 438/149; 438/286; 365/189
(58) Field of Search ............................... 438/149, 199, 438/200, 201, 239, 286, 290; 365/154, 189, 200, 201, 185, 159

(56) References Cited

U.S. PATENT DOCUMENTS

| | | | | |
|---|---|---|---|---|
| 5,378,934 A | * | 1/1995 | Takahashi et al. | 327/203 |
| 5,745,414 A | * | 4/1998 | Engh et al. | 365/154 |
| 5,917,764 A | * | 6/1999 | Ohsawa et al. | 365/200 |
| 6,065,141 A | * | 5/2000 | Kitagawa | 714/711 |
| 6,072,737 A | * | 6/2000 | Morgan et al. | 365/201 |
| 6,163,476 A | * | 12/2000 | Marr et al. | 365/154 |

FOREIGN PATENT DOCUMENTS

WO          0062339          10/2000

* cited by examiner

*Primary Examiner*—Hoai V. Ho
*Assistant Examiner*—Phuc T. Dang
(74) *Attorney, Agent, or Firm*—Antonelli, Terry, Stout & Kraus, LLP

(57) ABSTRACT

A logic test having less over-head for testing a logic circuit in a chip is implemented by constituting a test circuit in the chip without introducing a novel device process of FPGA. A memory of a self-configuration type is provided in the chip and a test circuit is constituted in the memory of a self-configuration type or an ordinary memory through a tester HDL, thereby testing other memories and logic circuits in the chip. The test circuit is reconstituted such that the memory used in the structure of the test circuit can be operated as an ordinary memory.

4 Claims, 17 Drawing Sheets

HDL DESCRIPTION
//External Declarations
module ff model(
In0,
In1,
Out0,
Out1
);
//Internal Declarations
input In0;
input In1;
output Out0;
output Out1;
wire In0;
wire In1;
reg Out0;
reg Out1;
//Local declarations
//Instaces
nand1_gate(
.In0(In0),
.In1(Out1),
.Out0(Out0)
);
nand2_gate(
.In2(Out0),
.In3(In3),
.Out0(Out1)
);
endomodule//ff_model

|   | In0 | In1 | In2 | In3 | Out0 | | Out1 | |
|---|-----|-----|-----|-----|------|---|------|---|
|   |     |     |     |     | d1 | A1 | d2 | A2 |
| a | 0 | 0 | 0 | 0 | 1 | 1 | 1 | 1 |
| b | 1 | 0 | 0 | 0 | 1 | 1 | 0 | 0 |
| c | 0 | 1 | 0 | 0 | 1 | 1 | 0 | 0 |
| d | 1 | 1 | 0 | 0 | 0 | 1 | 0 | 0 |
| e | 0 | 0 | 1 | 0 | 0 | 0 | 1 | 1 |
| f | 1 | 0 | 1 | 0 | 0 | 0 | 0 | 0 |
| g | 0 | 1 | 1 | 0 | 0 | 0 | 0 | 0 |
| h | 1 | 1 | 1 | 0 | 0 | 0 | 0 | 0 |
| i | 0 | 0 | 0 | 1 | 0 | 0 | 1 | 1 |
| j | 1 | 0 | 0 | 1 | 0 | 0 | 0 | 0 |
| k | 0 | 1 | 0 | 1 | 0 | 0 | 0 | 0 |
| l | 1 | 1 | 0 | 1 | 0 | 0 | 0 | 1 |
| m | 0 | 0 | 1 | 1 | 0 | 0 | 0 | 1 |
| n | 1 | 0 | 1 | 1 | 0 | 0 | 0 | 0 |
| o | 0 | 1 | 1 | 1 | 0 | 0 | 0 | 0 |
| p | 1 | 1 | 1 | 1 | 0 | 0 | 0 | 0 |

FIG. 15(A)
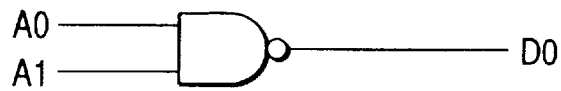
FIG. 15(B)
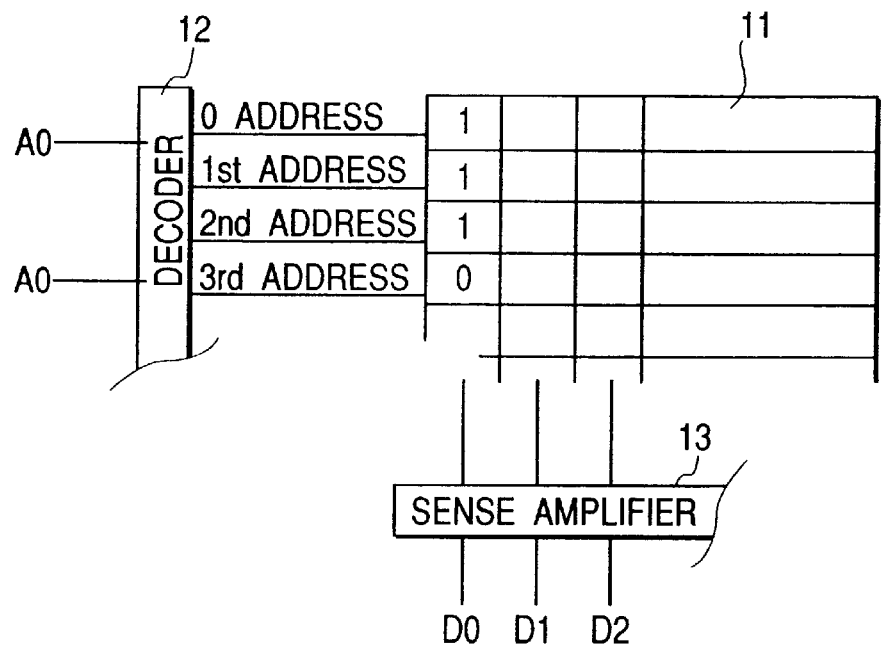
FIG. 15(C)
| A0 | A1 | MEMORY ADDRESS | 00 |
|---|---|---|---|
| 0 | 0 | 0 ADDRESS | 1 |
| 1 | 0 | 1st ADDRESS | 1 |
| 0 | 1 | 2nd ADDRESS | 1 |
| 1 | 1 | 3rd ADDRESS | 0 |

| A0 | A1 | A2 | MEMORY ADDRESS | OUTPUT |
|----|----|----|----------------|--------|
| 0  | 0  | 0  | 0 ADDRESS      | 0      |
| 1  | 0  | 0  | 1st ADDRESS    | 0      |
| 0  | 1  | 0  | 2nd ADDRESS    | 0      |
| 1  | 1  | 0  | 3rd ADDRESS    | 1      |
| 0  | 0  | 1  | 4th ADDRESS    | 1      |
| 1  | 0  | 1  | 5th ADDRESS    | 0      |
| 0  | 0  | 1  | 6th ADDRESS    | 1      |
| 1  | 1  | 1  | 7th ADDRESS    | 1      |
| CK | D  | Q' |                | Q      |

SEMICONDUCTOR INTEGRATED CIRCUIT DEVICE

CROSS-REFERENCE TO RELATED APPLICATION

This application is a divisional of application Ser. No. 09/803,030, filed on Mar. 12, 2001, the entire disclosure of which is hereby incorporated by reference.

FIELD OF THE INVENTION

The present invention relates to a semiconductor integrated circuit device and a technique for manufacturing the semiconductor integrated circuit device, and more particularly to a design for testability capable of reducing an over-head caused by having a test circuit in the semiconductor integrated circuit device, for example, an effective technique to be applicable to a semiconductor integrated circuit such as a system LSI (Large Scale Integrated Circuit) having a RAM (Random Access Memory) provided therein.

BACKGROUND OF THE INVENTION

In general, as a general design for testability in a logic LSI referred to as a system LSI having a RAM, a CPU and the like mounted thereon, there has been often used a scanning path methodology in which a flip-flop constituting an internal logic circuit is serially connected to input test data and the internal logic circuit is operated to check a logic status. Ten years or more have passed since this technology has been proposed as an LSSD (Level Sensitive Scan Design) method, and furthermore, this technology has an over-head of approximately 35% for hardware and a fault coverage of approximately 85%. There has been a problem in that a great deal of endeavor is required to increase the coverage still more.

In order to increase the fault coverage, moreover, it is necessary to remarkably increase the pattern capacity of a test pattern generator provided in a tester. Consequently, the price of the tester is increased considerably. Furthermore, test data should be input as serial data. Therefore, a great deal of time is required to input a test pattern. Therefore 50% or more of a test time is required for inputting the test pattern so that the effective availability of the tester is also reduced.

In addition to the scanning path methodology, there has been a BIST (Built-In Self Test) methodology in which a random pattern generator and a signature compression circuit are mounted on a chip as test circuits. The BIST methodology uses a random test pattern differently from logic testability based on a test pattern generated in accordance with a fault coverage algorithm to be used for the scanning path methodology. For this reason, whether or not a proper fault coverage is maintained is a big problem, and various techniques are to be developed to obtain an appropriate methodology.

Also in the case in which the BIST methodology is employed, furthermore, it is necessary to carry out a connection to a high-speed tester having high function used in the scanning path methodology, thereby performing measurement according to the control of the tester. In a test to be carried out in the BIST circuit, an expensive tester is often caused to stand by as a simple waiting time processing. Therefore, a test cost is not reduced. In order to eliminate such a drawback, the present inventors previously proposed a technique referred to as a so-called "logic with test function" in which a logic tester is constructed in a chip to carry out a self test, wherein a test circuit other than the BIST is provided in a chip to carry out measurement. In this methodology, an expensive tester is not required. Therefore, the test cost can be reduced considerably. In the same manner as in the BIST methodology, however, there has been a problem in that the over-head of hardware is great and the yield of a product is reduced due to faults of a test circuit itself which is mounted on a chip.

In order to solve such a problem, the present inventors had proposed a technique referred to as a so-called "non over-head test technique" in which an FPGA (Field Programmable Gate Array) is provided on a chip and an ALPG (Algorithmic Pattern Generator) is constructed by the FPGA to generate a test pattern in accordance with a predetermined algorithm to carry out a test and to reconstruct an ordinary logic circuit on the FPGA after the test ends (International Publication WO00/62339). According to this technique, a circuit referred to as a so-called self-testability type FPGA capable of detecting a self fault is provided in a user logic circuit and a test circuit is constituted to carry out a self test and to finally mount a user circuit on the FPGA, thereby reducing the over-head of hardware with test circuit mounting. In this technique, the FPGA is set to be the self-testability type circuit. Therefore, fault exposure is detected by itself and information about a fault portion is output to the outside, and a circuit can be constituted except for the fault portion when constructing a logic tester on the FPGA through a test HDL (Hardware Description Language) or constituting a user circuit. Therefore, there has been a character that a reduction in yield can be avoided.

Then, the present inventors have further investigated the technique referred to as the so-called "non over-head test technique" described above. As a result, it has been apparent that there are the following drawbacks. For example, in this technique, it is necessary to introduce a novel device process referred to as the FPGA. Although semiconductor manufactures providing the FPGA or a product mounting the FPGA to the market can implement this technique by slightly changing a process, general semiconductor manufactures do not manufacture the FPGA or the product mounting the FPGA. In order to develop this technique, therefore, it is necessary to design the FPGA and to improve a novel process for forming the FPGA on a semiconductor chip.

Moreover, the present inventors have proposed a technique referred to as a so-called "self-configuration chip" for memory device redundancy separately from the above-mentioned design for testability. In this technique, a memory is utilized as a re-configuration logic circuit by writing truth data of a combination circuit to the memory, inputting an address and outputting a predetermined logic result. The output of the memory is fed back to the input so that a sequential circuit as well as the combination circuit can be constituted. Therefore, the present inventors found that a so-called "self-configuration chip" capable of constituting an optional logic can be implemented and therefore filed the application. The present inventors further invented that application of the "self-configuration chip" technique to the "non over-head test technique" do not require the FPGA and the problem of the design of the FPGA and the development of the process can be solved.

It is, therefore, an object of the present invention to provide, without introducing a novel device process referred to as the FPGA, a semiconductor integrated circuit device and a method of manufacturing the semiconductor integrated circuit device in which a test circuit is provided in a chip to test a logic circuit in the chip so as to be capable of performing a logic test having less overhead.

The above and other objects and novel features of the present invention will be apparent from the description of this specification and the accompanying drawings.

SUMMARY OF THE INVENTION

The summary of the typical invention disclosed in this application will be described below.

More specifically, the present invention provides a semiconductor integrated circuit device comprising a storage circuit capable of reading and writing data in response to an input of an address signal, and a feedback path for feeding back a signal corresponding to data read from the storage circuit to an input terminal side of the address signal, wherein an input signal of a logic circuit is input as the address signal to the storage circuit and data are written to the storage circuit such that the data read from the storage circuit are changed into a logical output signal expected to the input signal so that the storage circuit can be operated as a logic circuit having desirable logic function.

According to the above-mentioned means, the storage circuit provided in the semiconductor integrated circuit device can be utilized as the logic circuit. Therefore, the test circuit for checking the other circuit in a semiconductor chip can be constituted on the storage circuit. Consequently, the logic test circuit can be constituted in the chip without introducing a novel device process of FPGA, and the storage circuit constituting the test circuit can be used as an ordinary storage circuit after the test is completed. Thus, it is possible to implement the test circuit having less over-head of hardware.

Moreover, it is desirable that the semiconductor integrated circuit device should further comprise a switch matrix capable of switching an input address signal sent to an input terminal and a signal read from the storage circuit and fed back through the feedback path and for supplying the switched signal to the storage circuit; and storage means for storing control information of each switch in the switch matrix. Consequently, a sequential circuit having an output varied depending on a last state as well as a combination circuit having optional logic function can be constituted in the storage circuit, and more complicated logic function can be implemented by using the storage circuit. In addition, the switch matrix and the storage means for storing control information of each switch in the switch matrix are provided. Therefore, it is very easy to constitute an optional sequential circuit in the storage circuit or an ordinary storage circuit by rewriting the control information to be stored in the storage means.

The present invention provides another semiconductor integrated circuit device comprising a plurality of storage circuits capable of reading and writing data in response to an input of an address signal; a part of the storage circuits including a memory array capable of reading and writing data from a memory cell specified by the address signal, an address decoder for decoding the address signal and generating a signal to select the memory cell; comparing means for comparing data written to the memory array with data read from the memory array; and variable address converting means for converting the address signal supplied to the address decoder based on a result of the comparison of the comparing means, wherein data are written to the storage circuit such that the data read from the storage circuit are changed into a logical output signal expected to the input signal so that the storage circuit can be operated as a logic circuit having desirable logic function.

According to the above-mentioned means, the address converting circuit is provided. Therefore, the write data can be written to the storage circuit to avoid a fail portion in the storage circuit and to obtain a desirable logical output signal. Consequently, yield can be enhanced.

Moreover, it is desirable that the semiconductor integrated circuit device should further comprise data holding means capable of holding data read from the memory array; a feedback path for feeding back the data held in the data holding means to an input side of the address decoder; a switch matrix capable of switching an input address signal or an output signal of the data holding means supplied through the feedback path so as to supply the switched signal to the variable address converting means; and storage means for storing control information of each switch in the switch matrix. Consequently, a sequential circuit having an output varied depending on a last state as well as a combination circuit having optional logic function can be constituted in the storage circuit, and more complicated logic function can be implemented by using the storage circuit.

Furthermore, the variable address converting means is constituted by a memory array including a plurality of memory cells; an address decoder for selecting a memory cell in the memory array based on an input address signal; reading means for amplifying a signal read from the memory array; and means for updating the input address signal based on a control signal. Consequently, it is possible to implement the variable address converting circuit by using the storage circuit without designing a novel circuit. Thus, a designer's burden can be relieved.

The present invention provides a further semiconductor integrated circuit device comprising a plurality of storage circuits; a first signal line group for supplying an address signal to the storage circuits; and a second signal line group for transmitting a write data signal and a read data signal of the storage circuits;

the storage circuits including a memory array capable of reading and writing data from a memory cell specified by the address signal; an address decoder for decoding the address signal and generating a signal to select a memory cell in the memory array; a feedback path for feeding back data read from the memory array to an input side of the address decoder; a switch matrix capable of switching an input address signal or a signal fed back through the feedback path so as to supply the switched signal to the address decoder, and storage means for storing control information of each switch in the switch matrix, wherein the switch matrix and the storage means for storing control information of each switch in the switch matrix are provided to be capable of optionally connecting a signal line of the first signal line group and a signal line of the second signal line group.

According to the above-mentioned means, the storage circuits provided in the semiconductor integrated circuit device can be utilized as the logic circuit. Therefore, the test circuit for checking the other circuit in a semiconductor chip can be constituted by using the storage circuits. Consequently, the logic test circuit. can be constituted in the chip without introducing a novel device process of FPGA, and the storage circuit constituting the test circuit can be used as an ordinary storage circuit after the test is completed. Thus, it is possible to implement the test circuit having less over-head of hardware.

It is desirable that the semiconductor integrated circuit device should further comprise a test access port to be an interface circuit for a test; the storage circuit constituting the test circuit capable of inputting and outputting a signal to and from an external device through the test access port. Consequently, the number of terminals for the test with the application of the present invention is slightly increased, and the number of pins in the whole semiconductor integrated circuit device can be decreased.

The storage circuit may be a writable nonvolatile memory or volatile memory, and desirably, the volatile memory. The nonvolatile memory requires a large number of peripheral circuits for writing such as a booster circuit and a time required for the writing is longer than that in the volatile memory. However, the use of the volatile memory can prevent an occupied area from being increased and a writing time from being prolonged.

Furthermore, the present invention provides a method of manufacturing a semiconductor integrated circuit device comprising a logic circuit and a plurality of storage circuits; a part of the storage circuits including a memory array capable of reading and writing data from a memory cell specified by the address signal; an address decoder for decoding the address signal and generating a signal to select a memory cell in the memory array; a feedback path for feeding back data read from the memory array to an input side of the address decoder; a switch matrix capable of switching an input address signal or a signal fed back through the feedback path so as to supply the switched signal to the address decoder; and storage means for storing control information of each switch in the switch matrix; and the part of the storage circuit acting as a storage circuit capable of constituting an optional logic based on data written to the memory array, comprising the steps of constituting, on the storage circuit capable of configuring an optional logic, a test circuit for checking another storage circuit or a logic circuit; testing the other storage circuit and the logic circuit by the test circuit, and reconstituting the storage circuit to be operated as an ordinary storage circuit after the test for another circuit and the logic circuit is completed.

According to the above-mentioned means, it is possible to carry out a self test through the test circuit constituting the storage circuit in the chip even if a test device having high function is not used. Therefore, it is possible to test a large number of semiconductor integrated circuit devices at the same time. Consequently, a manufacturing cost can be reduced considerably and a time required for the test can also be shortened.

Moreover, it is desirable that the method of manufacturing a semiconductor integrated circuit device should further comprise a redundancy processing step of replacing a fail memory cell detected at the test step with a spare memory cell after completing the test of the storage circuit in a case in which another storage circuit includes a redundant circuit for replacing the fail memory cell with the spare memory cell. Consequently, the redundancy of the fail memory cell as well as the test of other storage circuits can also be carried out by using the test circuit constituted in the storage circuit on the chip. Therefore, the burden of the external test device can also be relieved and the cost of the test can be reduced considerably.

Furthermore, it is desirable that at the testing step to be carried out by the test circuit, a result of the test obtained by the test circuit should be stored in a storage circuit other than the storage circuit constituting the test circuit. Consequently, the external device does not always monitor a signal indicative of the result of the test output from the external terminal of the semiconductor integrated circuit device during the test carried out by the test circuit, and the results of the test can be collectively read from the internal storage circuit after the test is completed. Thus, the efficiency of the test can be enhanced considerably.

Furthermore, at the step of constituting a test circuit on the storage circuit capable of configuring an optional logic, design data having a function level described in a hardware description language are decoded by control means and a signal for determining a logical structure of the storage circuit is given from the control means to the storage circuit so that a logic circuit having desirable logic function is constituted.

Consequently, the test circuit can be constituted in an SRAM to be a storage circuit of a self-configuration type based on the HDL description. Therefore, the test circuit can easily be constructed in the chip by using a computer. In addition, a test program to be used in an ordinary tester is available and debug for the test circuit is not required. Therefore, it is possible to implement the semiconductor integrated circuit device capable of considerably reducing the man-hour of a test design.

BRIEF DESCRIPTIONS OF THE DRAWINGS

Figure 1:
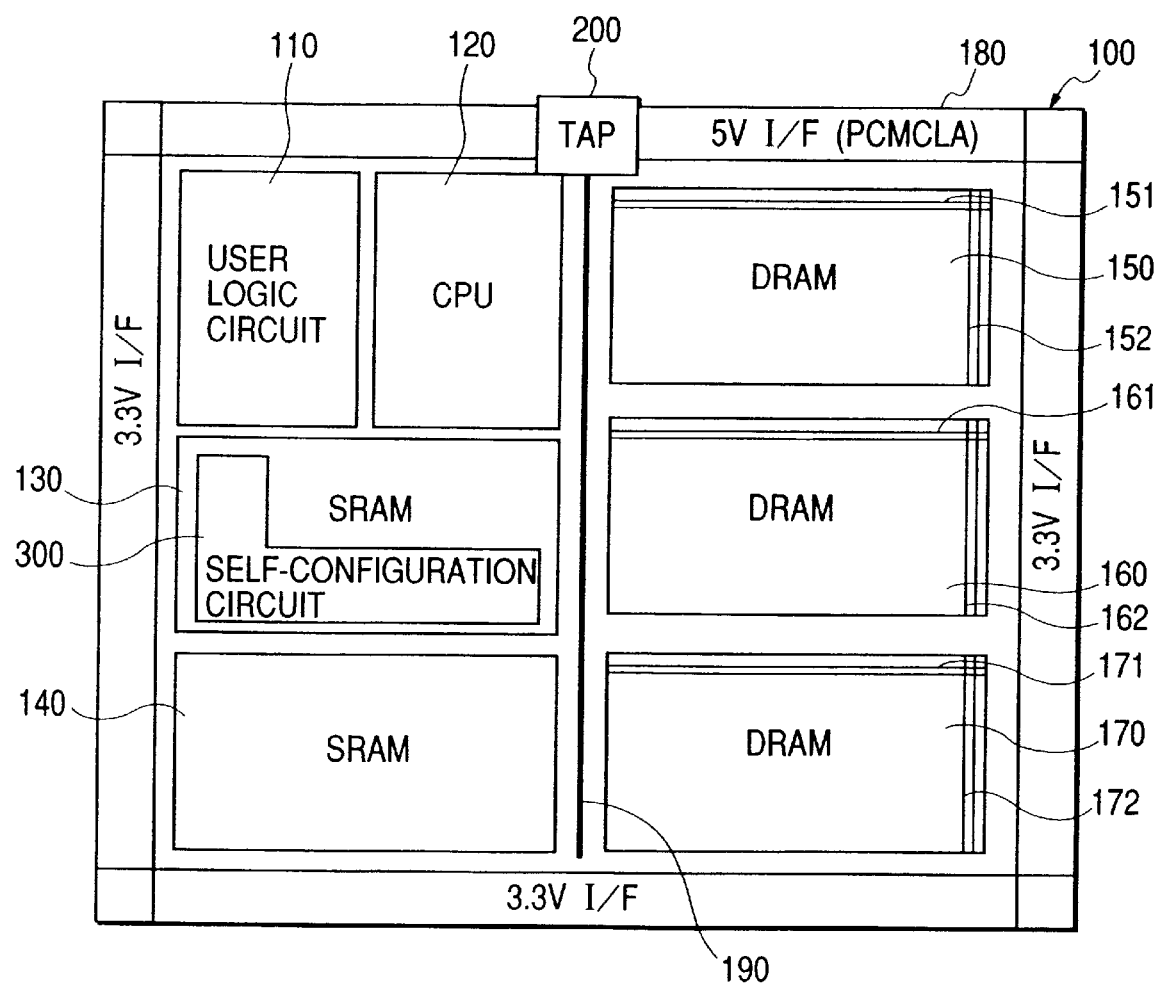
FIG. 1 is a block diagram showing an embodiment of a system LSI to which the present invention is applied.
Figure 2:
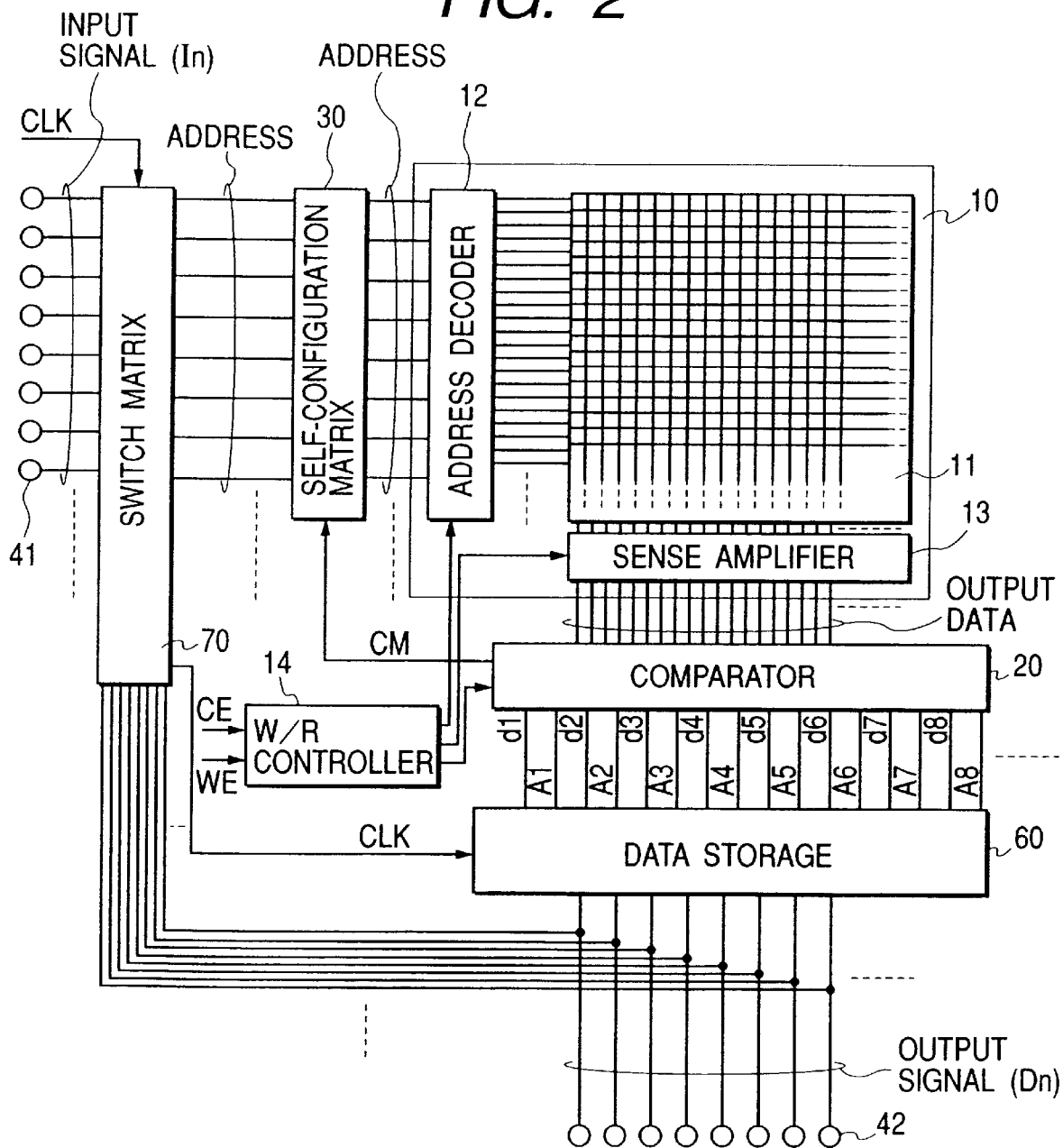
FIG. 2 is a block diagram showing an example of the structure of a self-configuration circuit provided in a part of an SRAM 130 illustrated in FIG. 1.
Figure 3A:
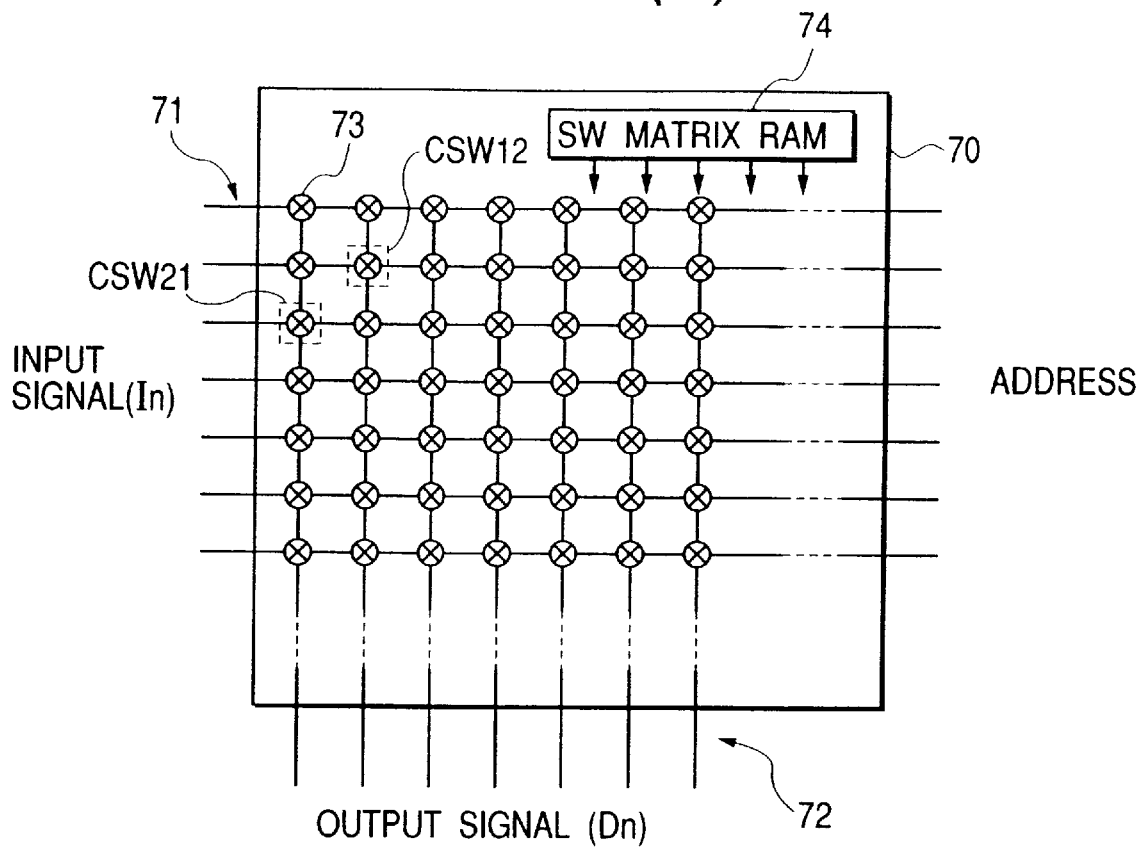
Figure 3B:
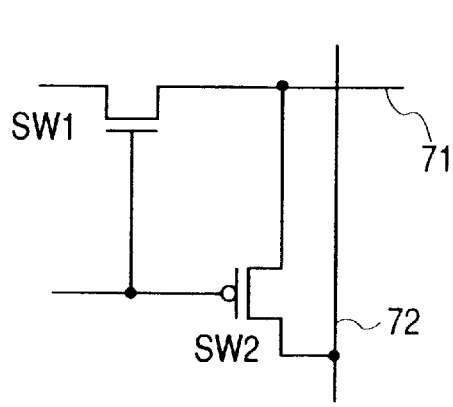
Figure 3C:
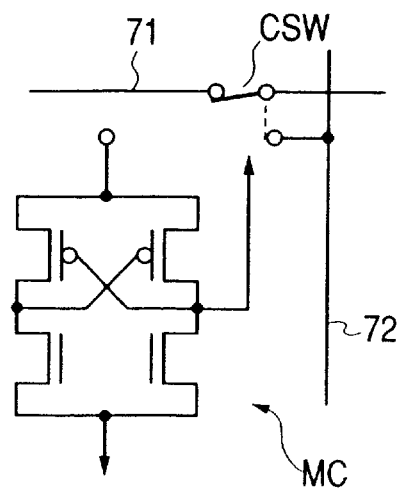
Figure 4:
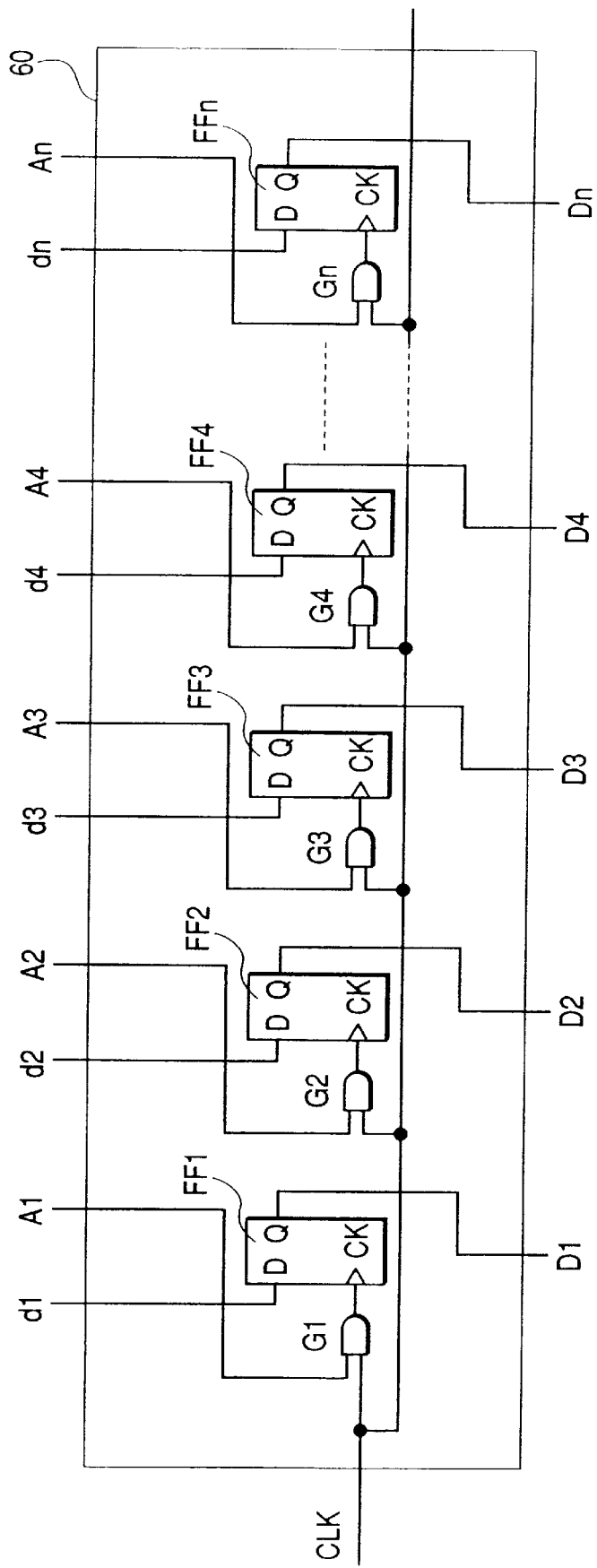
Figure 5:
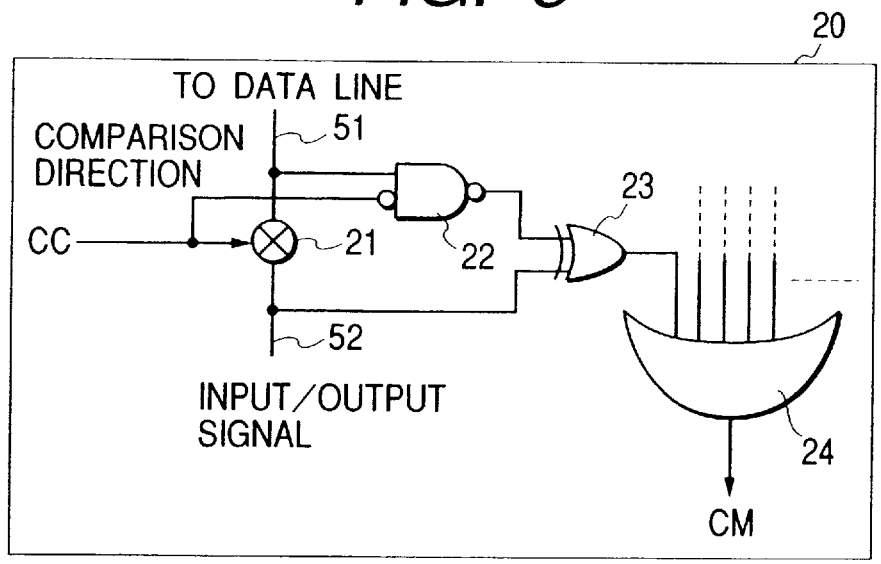
Figure 6:
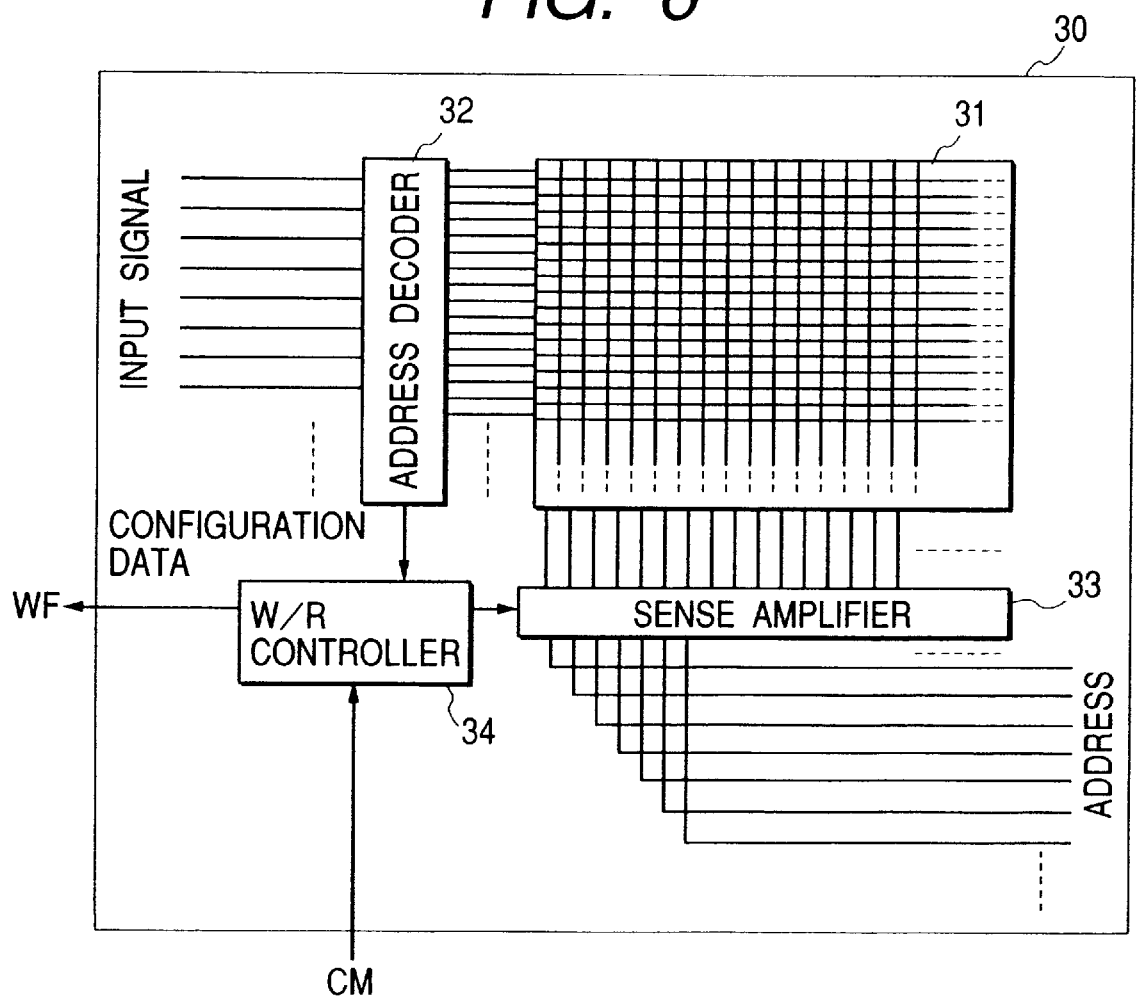
Figure 7:
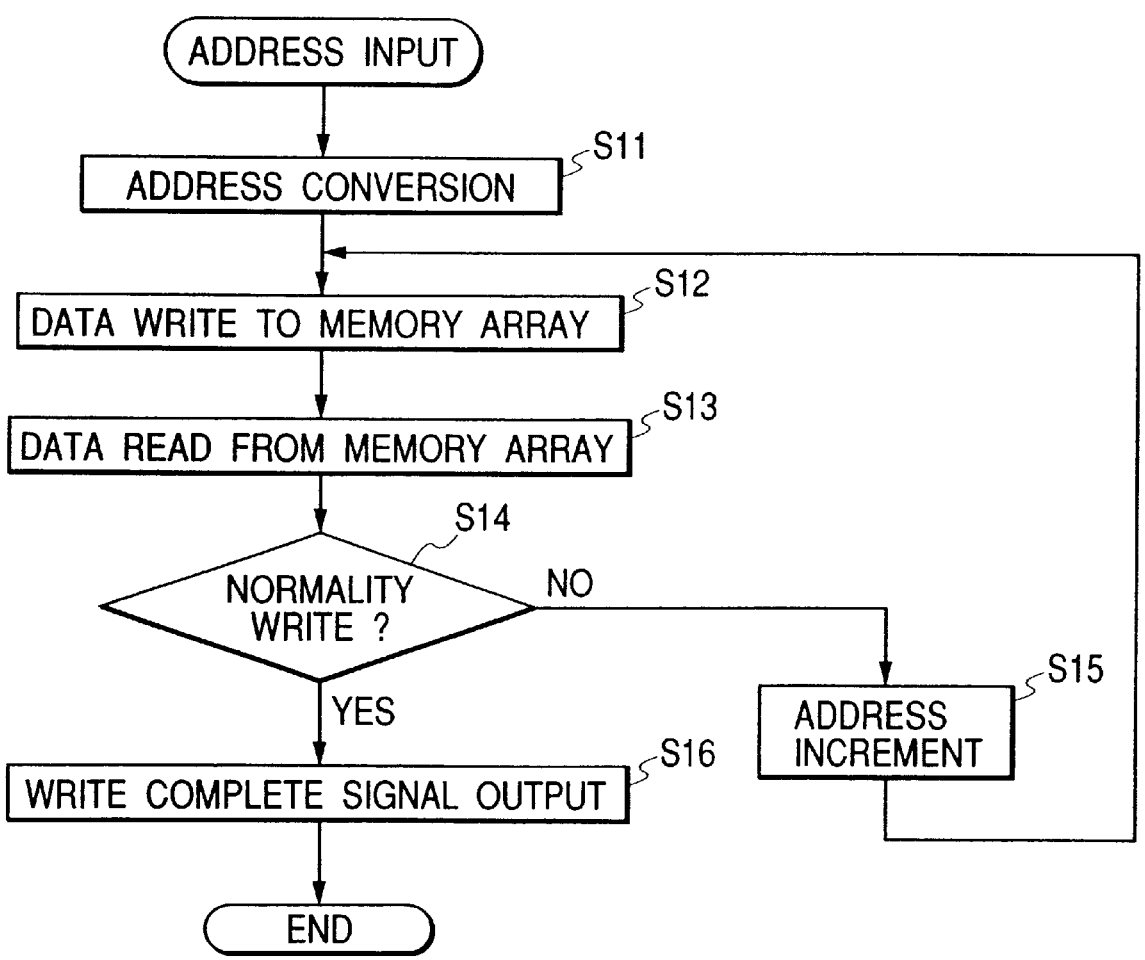
Figures 8A, 8B:
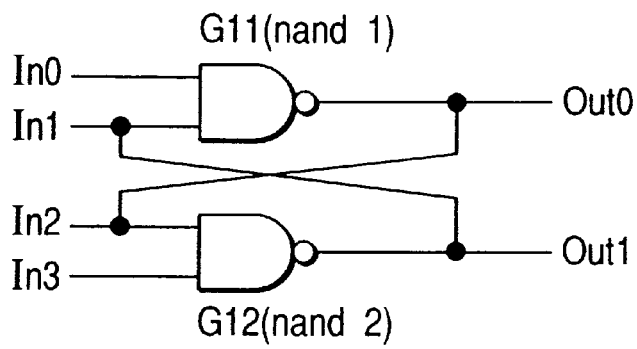
Figures 9, 10:
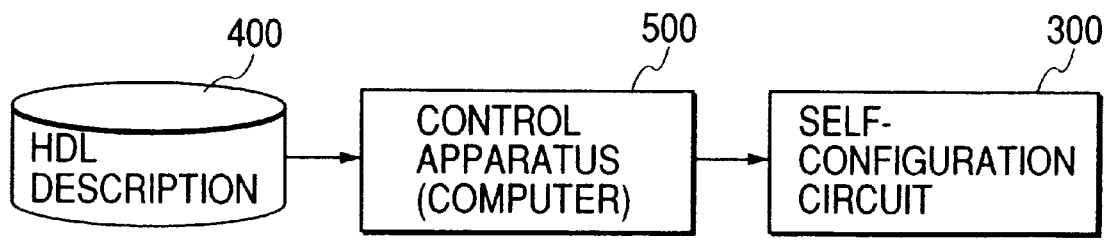
Figure 11:
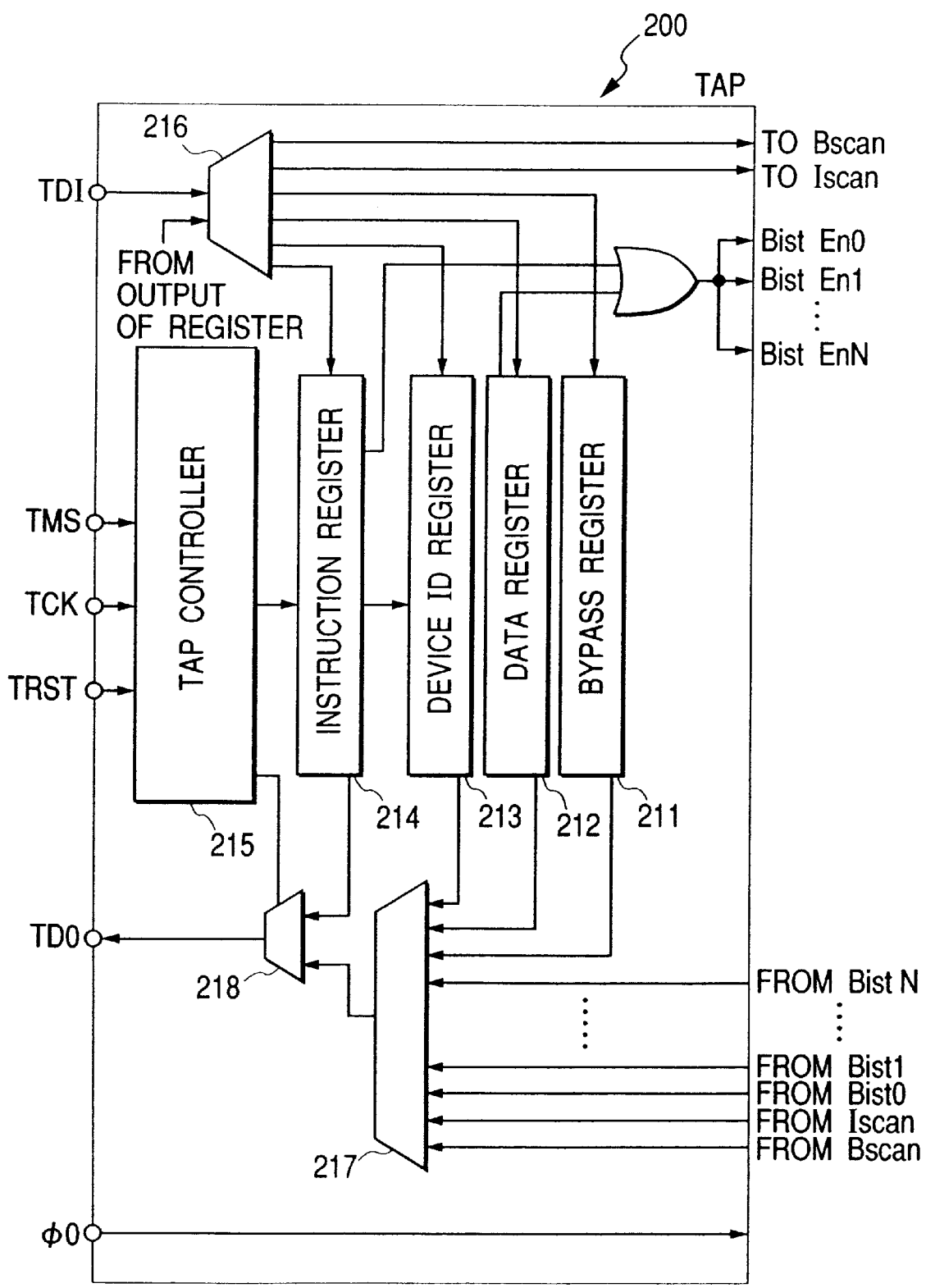
Figure 12:
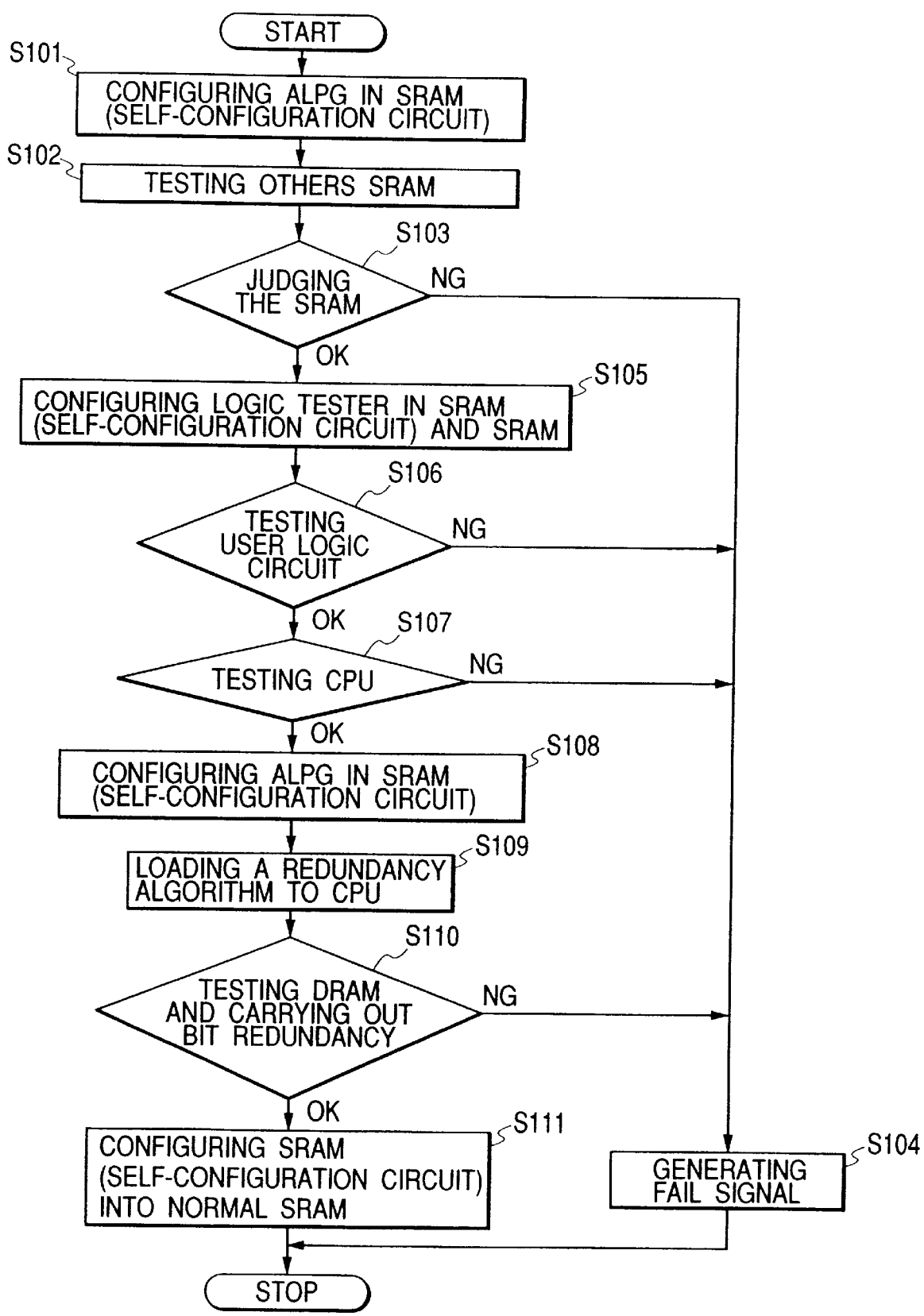
Figure 13:
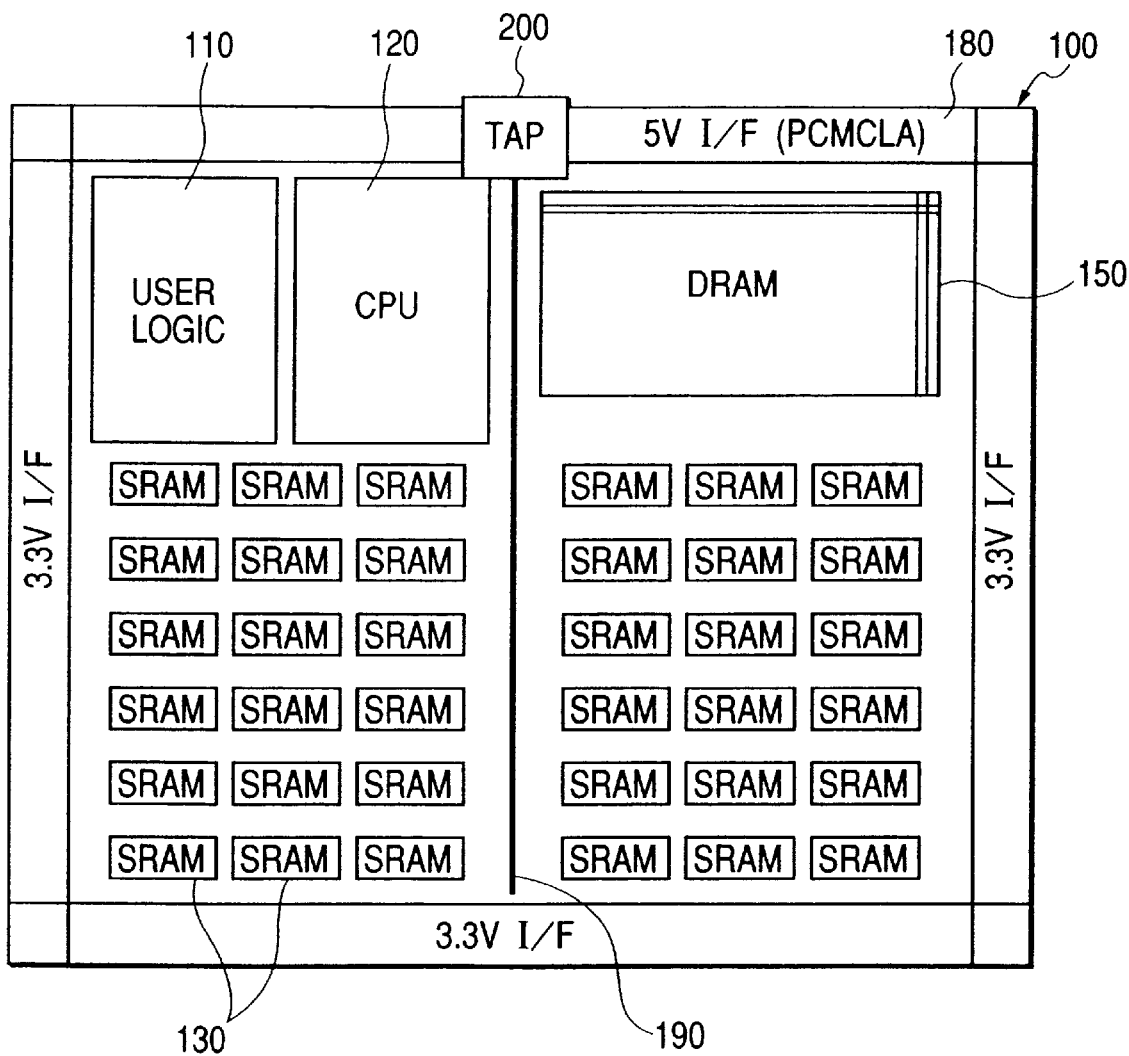
Figure 14:
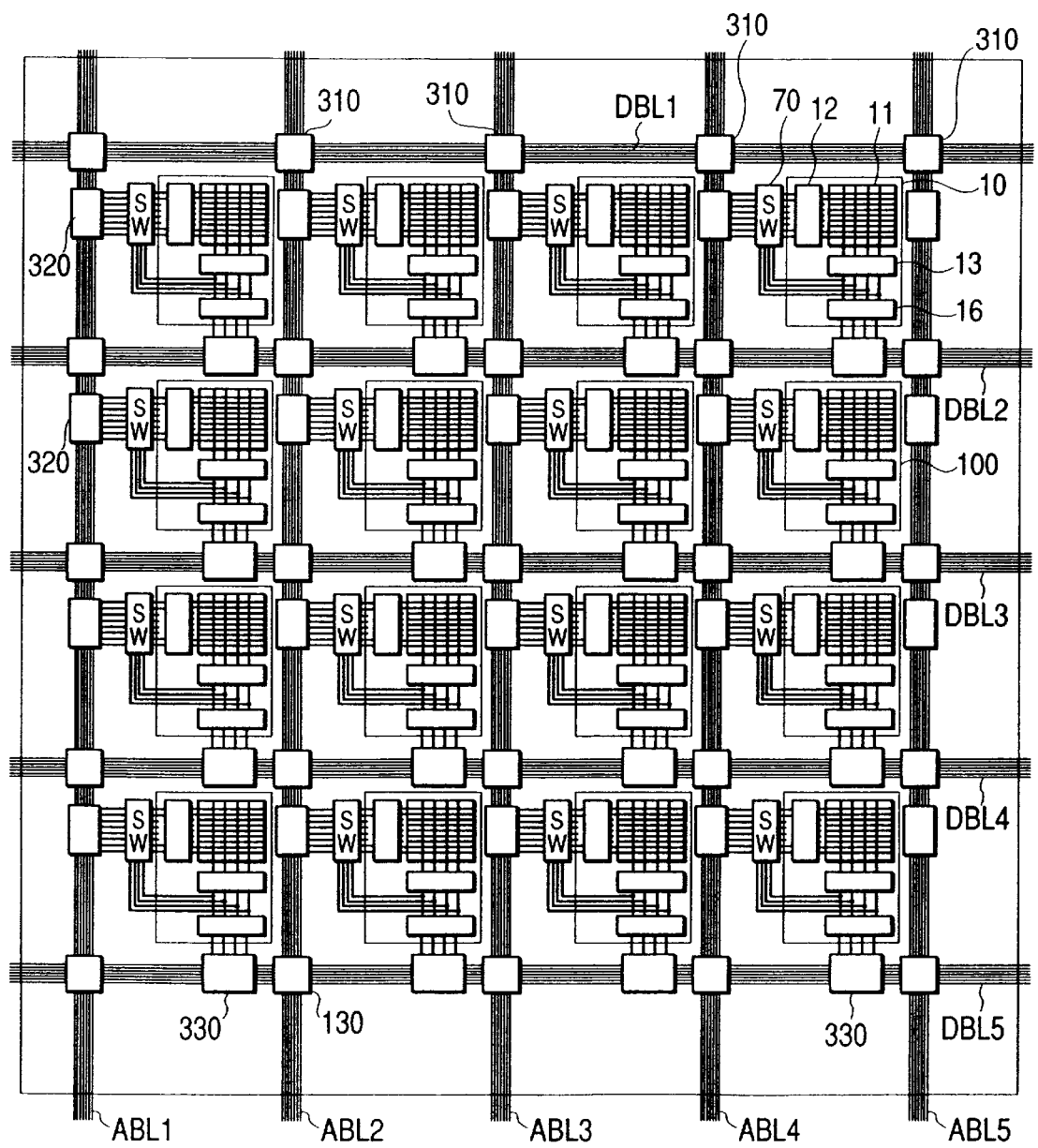
Figure 16A:
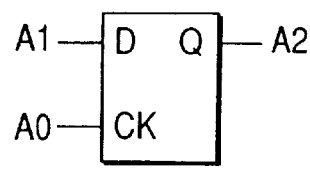
Figure 16C:
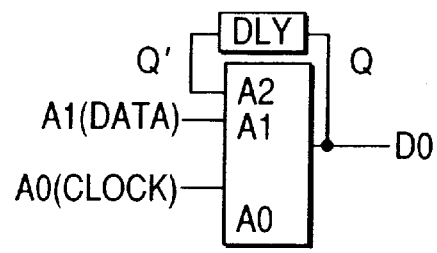
Figure 16B:
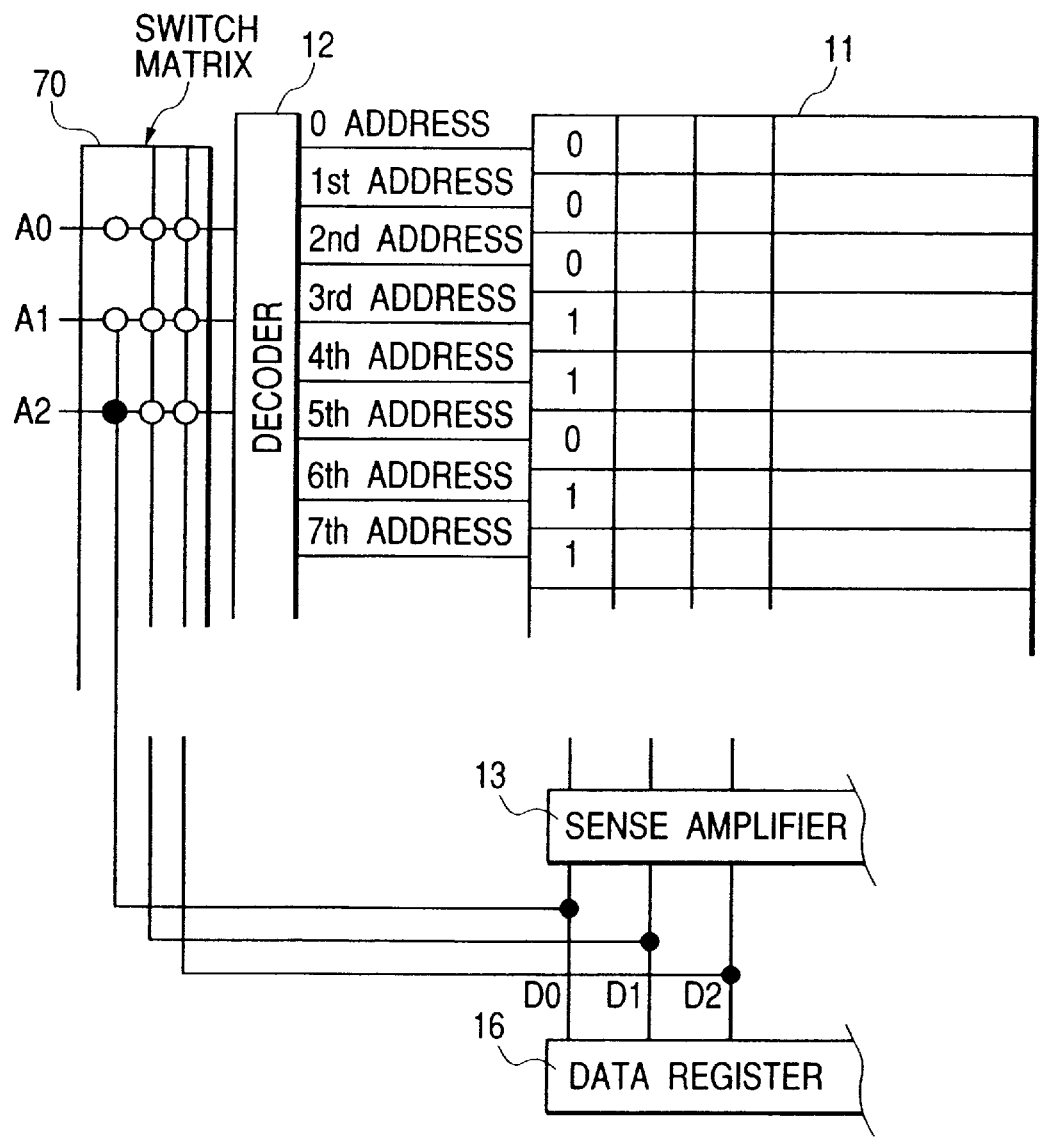
Figures 17, 18:
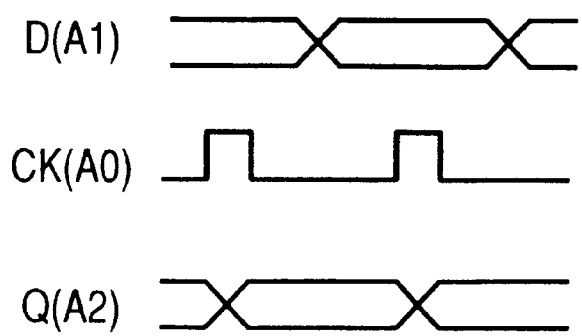
Figure 19:
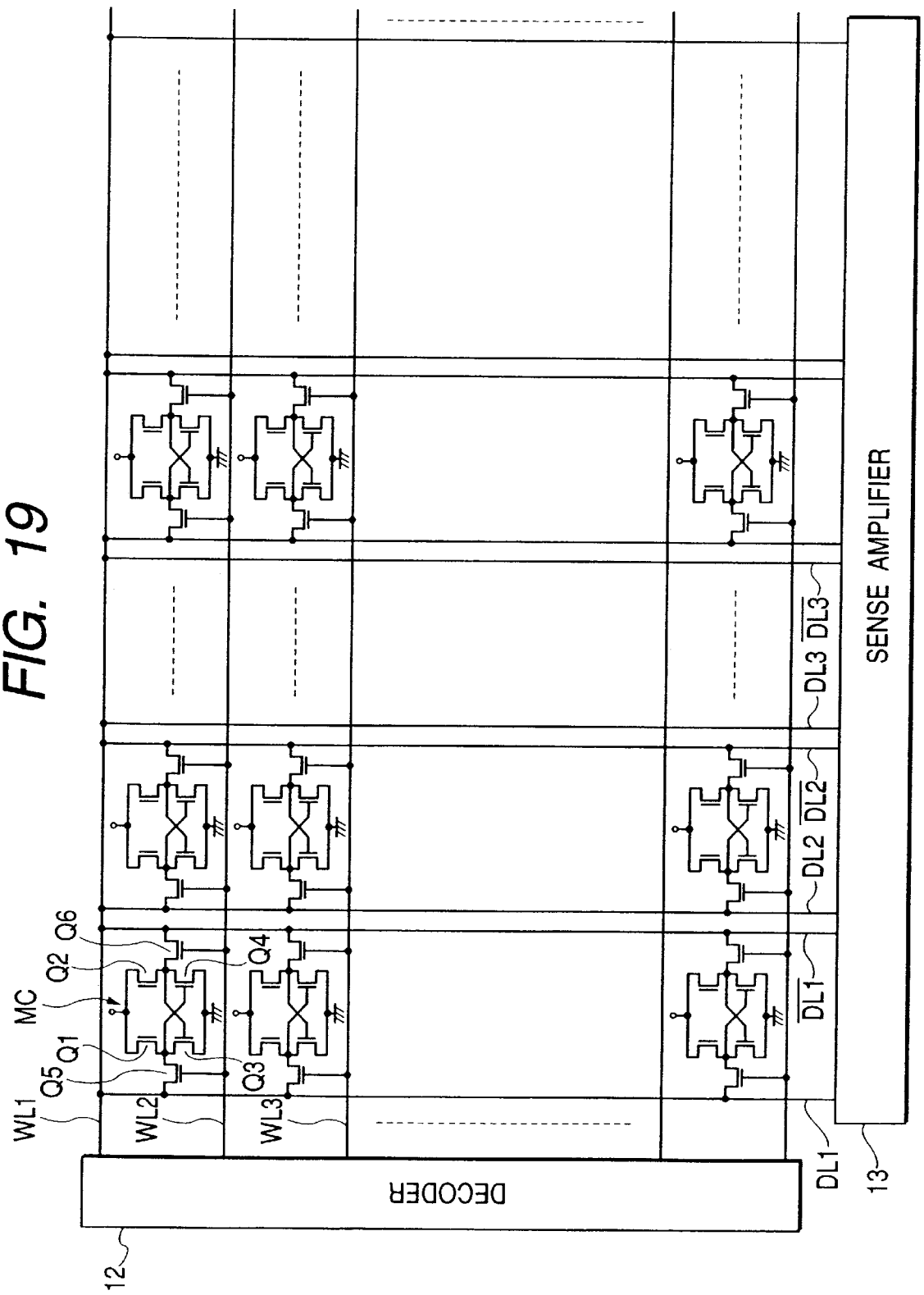
Figure 20:
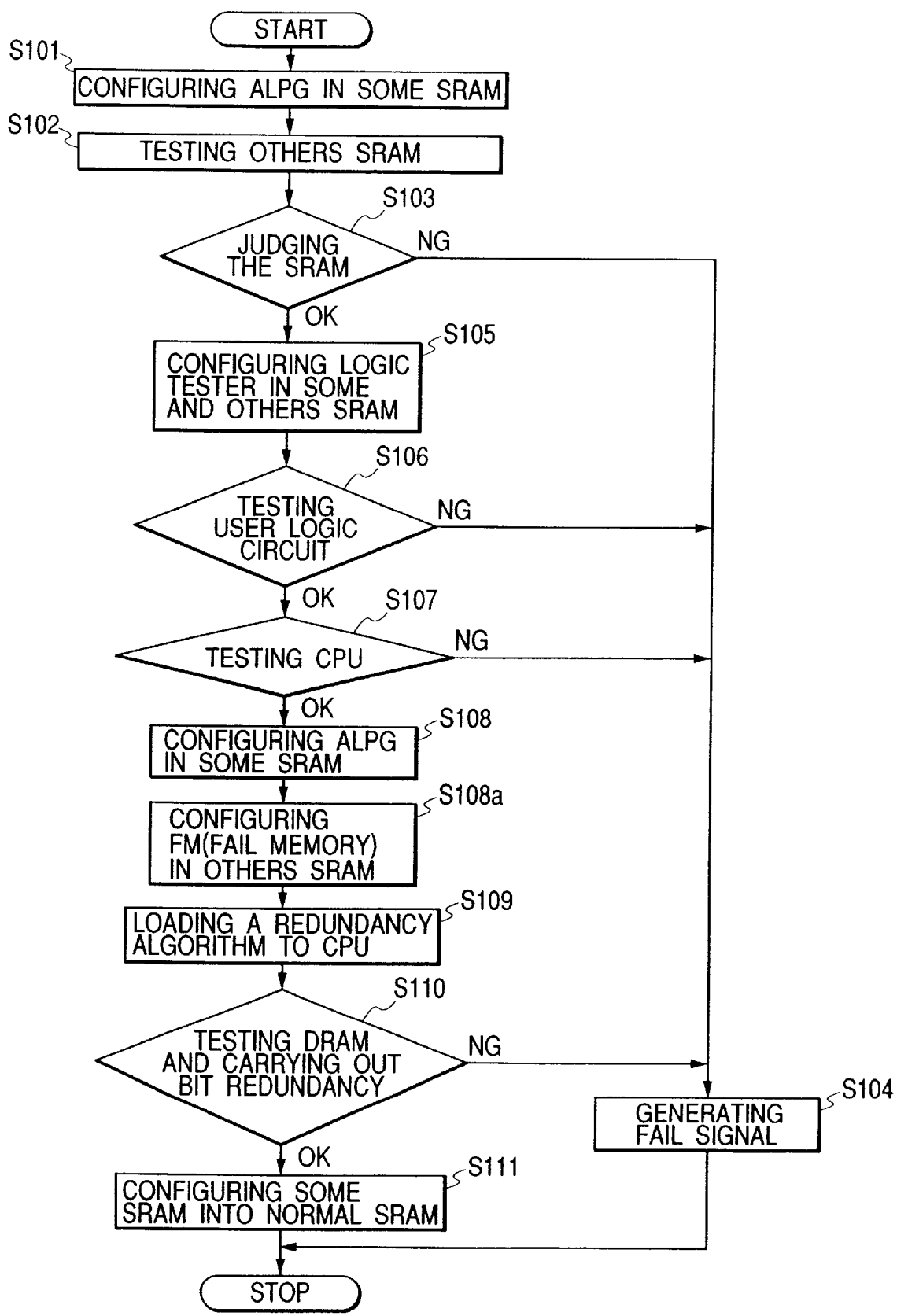

FIGS. 3(A) to 3(C) are diagrams showing a circuit structure according to a specific example of a switch matrix 70 included in the self-configuration circuit according to the embodiment illustrated in FIG. 2: FIG. 3(A) showing a switch matrix 70, FIG. 3(B) showing a switch 73, and FIG. 3(C) showing a circuit structure having a switch CSW and a static memory cell MC in place of RAM 74;

FIG. 4 is a diagram showing a circuit structure according to a specific example of a data storage circuit 60;

FIG. 5 is a diagram showing a circuit structure according to a specific example of a comparator 20;

FIG. 6 is a diagram showing a circuit structure according to a specific example of a self-configuration matrix 30;

FIG. 7 is a flow chart showing an example of the procedure for changing a conversion address in the self-configuration circuit according to the embodiment;

FIG. 8(A) is a diagram showing the structure of a flip-flop circuit according to an example of a logic circuit constituted by the self-configuration circuit illustrated in FIG. 2, and FIG. 8(B) is a diagram showing an example of HDL description thereof;

FIG. 9 is a diagram showing a truth table of the flip-flop illustrated in FIG. 8(A);

FIG. 10 is a block diagram showing an example of a system constituting a logic circuit having desirable logic function in accordance with HDL description by using s self-configuration circuit 300 according to the embodiment illustrated in FIG. 2;

FIG. 11 is a block diagram showing a specific example of an interface circuit 200 using a TAP illustrated in FIG. 1;

FIG. 12 is a flow chart showing the procedure of a method of manufacturing a system LSI according to an example of a semiconductor integrated circuit device illustrated in FIG. 1;

FIG. 13 is a block diagram showing another embodiment of a system LSI to which the present invention is applied;

FIG. 14 is a diagram showing the structure of an SRAM provided on a semiconductor chip according to an embodiment illustrated in FIG. 13 and the connection relationship thereof;

FIG. 15(A) is a logic symbol diagram of a flip-flop circuit according to an example of a logic circuit constituted by the SRAM illustrated in FIG. 13, FIG. 15(B) is a logic structure diagram of the flip-flop circuit, and to FIG. 15(C) is a diagram showing the relationship between an address signal and a specified address;

FIG. 16(A) is a logic symbol diagram of D type flip-flop circuit according to an example of the logic circuit constituted by the SRAM illustrated in FIG. 13, FIG. (B) is a logic structure diagram of the flip-flop circuit, and to FIG. 16(C) is an equivalent circuit diagram of t he flip-flop circuit;

FIG. 17 is a diagram showing the relationship between an address signal and a specified address in the flip-flop circuit illustrated in FIG. 16;

FIG. 18 is a timing chart showing a timing of an input/output signal in the flip-flop circuit illustrated in FIG. 16;

FIG. 19 is a circuit diagram showing a specific example of the SRAM circuit illustrated in FIG. 13; and FIG. 20 is a flow chart showing the procedure for a method of manufacturing the system LSI illustrated in FIG. 13.

DESCRIPTION OF THE PREFERRED EMBODIMENTS

Preferred embodiments of the present invention will be described below with reference to the drawings.

FIG. 1 is a block diagram showing an embodiment of a system LSI to which the present invention is applied. The system LSI is constituted on one semiconductor chip 100 such as a single crystal silicon through a technique for manufacturing a well-known semiconductor integrated circuit.

In FIG. 1, the reference numerals 110 to 170 denote internal circuits constituted on the semiconductor chip 100, the reference numeral 180 denotes an interface circuit for inputting and outputting a signal between the internal circuits and an external device, and the reference numeral 190 denotes an internal bus for connecting the internal circuits 110 to 170 mutually and between the internal circuits 110 to 170 and the interface circuit 180. The internal circuit 110 is a custom logic circuit such as a user logic circuit constituting logic function requested by a user, the internal circuit 120 is a CPU (central processing unit) for decoding the instruction of a program and executing a corresponding processing and operation, the internal circuits 130 and 140 are static RAMs (random access memories), and the internal circuits 150 to 170 are dynamic RAMs. The interface circuit 180 is not particularly restricted but includes an interface circuit 5VI/F for transmitting and receiving a signal to and from a 5V system LSI and an interface circuit 3.3VI/F for transmitting and receiving a signal to and from a 3.3V system LSI.

Furthermore, the system LSI according to the present embodiment is not particularly restricted but a signal is input and output to and from an external tester during the test of the internal circuit. Therefore, a TAP (Test Access Port) 200 defined by the IEEE 1149.1 standard is provided as an interface circuit for a test. A tester to be connected to the semiconductor integrated circuit according to the present embodiment through the TAP 200 does not require high function differently from a tester of a conventional logic LSI or a memory so that it may be a device that data can be written and read and an easy data processing can be carried out. Thus, a personal computer can also be used.

The static RAMs 130 and 140 and the dynamic RAMs 150 to 170 include a memory peripheral circuit such as an address decoder for selecting a corresponding memory cell when an address signal is sent through the internal bus 190. Furthermore, the dynamic RAMs 150 to 170 include a refresh control circuit to be pseudo selected cyclically such that the information charges of a memory cell are not lost even if a non-access time is prolonged. In the present embodiment, moreover, the dynamic RAMs 150 to 170 are provided with a so-called redundant circuit for replacing a memory row or a memory line including a defective bit in a memory cell array with preliminary memory rows 151 to 171 or preliminary memory lines 152 to 172, which is not particularly restricted. In the present embodiment, a self-configuration circuit 300 capable of constituting an optional logic is provided in a part of the SRAM 130.

FIG. 2 is a block diagram showing an example of the structure of the self-configuration circuit provided in a part of the SRAM 130 illustrated in FIG. 1.

In FIG. 2, the reference numeral 10 denotes a readable and writable memory circuit having almost the same structure as that of a well-known general-purpose DRAM (dynamic random access memory) or an SRAM (static random access memory).

More specifically, the memory circuit 10 is constituted by a memory array 11 in which a plurality of memory cells are arranged in a matrix, a plurality of word lines and a plurality of data lines are arranged in a grid, the memory cells in the same row are connected to the corresponding word lines respectively, and the memory cells in the same line are connected to the corresponding data lines respectively; an address decoder 12 for decoding a supplied address signal to set one of the corresponding word lines in the memory array 11 to a selection level; a sense amplifier circuit 13 for amplifying an electric potential read from the memory cell connected to the selected word line onto the data line; a write and read controller 14 for controlling an operation timing of the sense amplifier circuit 13 or the like based on a chip selection signal CE and a write control signal WE; and the like.

The self-configuration circuit according to the present embodiment comprises, in addition to the memory circuit 10, a comparator 20 for fetching write data input from the outside of a chip and transferring the write data to the sense amplifier circuit 13, for outputting data read from the memory circuit 10 to the outside of the chip, and for comparing the read data with the data input from the outside of the chip; a self-configuration matrix 30 to be variable address converting means for converting an address signal input to an address input terminal 41 from the outside of the chip according to a result of comparison in the comparator 20 and for supplying the converted address signal to the address decoder 12; a data storage 60 provided between the comparator 20 and a data input/output terminal 42 and serving to hold the data read from the memory circuit 10 or the last input data input from the data input/output terminal 42; and a switch matrix 70 for changing the data held in the data storage 60 into an input address signal and for supplying the input address signal to the self-configuration matrix 30.

FIG. 3 shows a specific example of the switch matrix 70 included in the self-configuration circuit according to the embodiment illustrated in FIG. 2.

As shown in FIG. 3(A), in the switch matrix 70, a plurality of signal lines 71 for sending the address signal input to the address input terminal 41 and a signal line 72 for sending a feedback signal (Dn) from the data storage 60 are provided in a grid to intersect each other and a switch 73 is provided on each intersecting point of the signal lines 71 and 72. In addition, a RAM 74 for storing the control information of each switch 73 is provided.

As shown in FIG. 3(B), the switch 73 is constituted by switch elements SW1 and SW2 comprising a pair of MOSFETs connected between the signal lines 71 and 72 to be turned ON/OFF complementarily in order to select and output the address signal input from the address input terminal 41 or the output signal of the data storage 60. A gate terminal of each of the switch elements SW1 and SW2 is controlled in accordance with control information stored in the RAM 74. In place of the RAM 74, a switch CSW and the same static memory cell MC as the SRAM cell may be provided on each intersecting point of the signal lines 71 and 72 as shown in FIG. 3(C). The switch CSW integrates the switch elements SW1 and SW2 shown in FIG. 3(B).

FIG. 4 shows a specific example of the data storage circuit 60 included in the self-configuration circuit. In FIG. 4, only a path for outputting data read from the memory array 11 is shown and a path for data written to the memory array 11 is omitted.

The data storage circuit 60 is constituted by flip-flops FF1, FF2, ... FFn provided corresponding to every two data lines of the memory array 11 in the memory circuit 10 and gates G1, G2, ... Gn for forming a clock for latch of each flip-flop as shown in FIG. 4.

In each flip-flop FFi (i=0 to n), one (di) of signals of the data lines making a pair is input to a data input terminal D. Moreover, the other signal (Ai) of the data lines making a pair is input to an AND gate Gi together with a system clock signal CLK. An output signal of the AND gate Gi is input to a clock terminal CK of the flip-flop FFi corresponding thereto, and an input signal sent to a data terminal D is fetched into the flip-flop FFi synchronously with the fall or rise of the signal sent to the clock terminal CK.

In the circuit shown in FIG. 4, when the signal Ai is set to the LOW level, the output of the AND gate Gi is fixed to the LOW level. Therefore, even if the system clock CLK is changed, the corresponding flip-flop FFi does not carry out a latch operation. In other words, in the present embodiment, the signal Ai is used as a signal for controlling the fetch of data to the flip-flop FFi (which will be hereinafter referred to as an active bit).

By using the data storage 60 having the above-mentioned operation characteristic, data read from the memory circuit 10 are selectively held according to a certain input state and are supplied to the self-configuration matrix 30 through the switch matrix 70, so that the next input state can be controlled based on the last output data. Consequently, it is possible to easily understand that a sequential circuit can be constituted.

FIG. 5 shows a specific example of the comparator 20 included in the self-configuration circuit according to the embodiment illustrated in FIG. 2.

As shown in FIG. 5, the comparator 20 is constituted by switch means 21 provided between a signal line 51 connected to the output terminal of the sense amplifier circuit 13 and a signal line 52 connected to the data input/output terminal 42 and controlled in response to a comparison directions signal CC supplied from the write and read controller 14; a NAND gate circuit 22 for setting a read signal sent from the sense amplifier circuit 13 and the comparison directions signal CC supplied from the write and read controller 14 to be input signals; an exclusive OR gate circuit 23 for inputting the output signal of the NAND gate circuit 22 and a signal input from the data input/output terminal 42; and an OR gate circuit 24 for inputting the output signals of the exclusive OR gate circuits 23.

More specifically, a comparison circuit including the switch means 21, the NAND gate circuit 22 and the exclusive OR gate circuit 23 is provided for each of the data input/output terminals 42; the output signal of the exclusive OR gate circuit 23 in the comparison circuit is input to the OR gate circuit 24; and the output signal of the OR gate circuit 24 is supplied as a comparison result signal CM to the self-configuration matrix 30. An input buffer and an output buffer which are connected to the data input/output terminal 42 in common may be provided of the signal line 52 side, which is not shown.

FIG. 6 is a block diagram showing a specific example of the self-configuration matrix 30 included into the self-configuration circuit according to the embodiment of FIG. 2. The self-configuration matrix 30 has almost the same circuit structure as that of the memory circuit 10 shown in FIG. 2.

More specifically, the self-configuration matrix 30 is constituted by a memory array 31 in which a plurality of memory cells are arranged in a matrix, a plurality of word lines and a plurality of data lines are arranged in a grid, the memory cells in the same row are connected to the corresponding word lines respectively, and the memory cells in the same line are connected to the corresponding data lines respectively; an address decoder 32 for decoding an address signal supplied from the outside to the input terminal 41 so as to set one of the corresponding word lines in the memory array 31 to a selection level; a sense amplifier circuit 33 for amplifying an electric potential read from the memory cell connected to the selected word line onto the data line; a write and read controller 34 for controlling an operation timing of the sense amplifier circuit 13 based on a comparison result signal CM sent from the comparator 20; and the like.

The address decoder 32 includes a decode circuit for decoding an address and an incrementer or an operation unit for incrementing or updating the address to be decoded based on the comparison result signal CM, which is not shown.

Next, the way of changing a conversion address in the self-configuration circuit according to the embodiment will be described with reference to a flow chart shown in FIG. 7. Before a flow chart shown in FIG. 7 is started, an address corresponding to each address of the memory circuit 10 is stored in each address in the memory array 31 in the self-configuration matrix 30 through an initializing processing or the like.

When an address signal is input from the outside to the address input terminal 41, the address decoder 32 in the self-configuration matrix 30 decodes the address signal, sets a corresponding word line in the memory array 31 to a selection level, and outputs prestored address data, that is, carries out address conversion (Step S11). The address data thus read are amplified by the sense amplifier 33 and are then supplied to the address decoder 12 of the memory circuit 10. The address decoder 12 decodes the supplied address, sets a corresponding word line in the memory array 11 to a selection level, and writes data input from the outside to a selection memory cell through the comparator 20 at that time (Step S12).

Next, the write data are read from the memory array 11 (Step S13). The data thus read are amplified by the sense amplifier 13 and are then supplied to the comparator 20. At this time, the write data input during data writing are input to the data input/output terminal 41. Consequently, the comparator 20 compares the data read from the memory array 11 with the write data input to the data input/output terminal 41, and outputs a comparison result signal CM indicative of coincidence or non-coincidence to the write and read controller 34 of the self-configuration matrix 30.

Then, the write and read controller 34 judges whether or not the write has normally been carried out based on the comparison result signal CM (Step S14). When the write and read controller 34 judges that the write is failed, it sends a signal to the address decoder 32 to operate the internal incrementer and updates (increments) an input address signal to be sent to the memory circuit 10 (Step S15). Consequently, the updated address is supplied to the address decoder 12 and is then decoded and a next word line in the memory array 11 is set to the selection level. Subsequently, the processing returns to the Step S12 where the data input from the outside through the comparator 20 are written to a selection memory cell connected to the word line.

Next, the write data are read from the memory array 11 again and are compared with the data input from the outside to the data input/output terminal 42 through the comparator 20. Then, when they are coincident with each other, the write and read controller 34 outputs a write end signal WF to the outside and an operation for writing data to one address is completed (Step S16). Upon receipt of the write end signal WF, an external control circuit generates a next address signal and inputs the same signal to the address input terminal 41. Correspondingly, the write control flow in FIG. 7 is started from the Step S1 again and the writing processing for a next address is executed.

As described above, in the present embodiment, the write data are read and judged after data writing, the address is updated if there is an error, and the data are written to a next address position. Consequently, even if there is a defect in the memory array 11, the address is automatically jumped and the data are written to a next address. In the self-configuration circuit according to the present embodiment, therefore, there is an advantage that all the memory cells in the memory array 11 do not need to be normal, and furthermore, a test for finding a fail bit in the memory array does not need to be carried out in advance.

While the case in which whether the memory array 11 has a defect is judged and the write is then carried out, has been described in the embodiment, the output signal line of the sense amplifier 33 of the self-configuration matrix 30 in FIG. 6 can be supplied to the comparator 20 in FIG. 2 as well as the address decoder 12 of the memory circuit 10. In the same manner as in the foregoing, it is judged whether the data to be written to the memory array 31 are normal or abnormal and the address is jumped if the write data are abnormal. Referring to the memory array 31, consequently, all the memory cells do not need to be normal, and furthermore, it is not necessary to previously carry out a test for finding a fail bit in the memory array.

FIG. 8 shows an example of the flip-flop circuit as a logic circuit constituted by the self-configuration circuit shown in FIG. 2 and HDL description thereof. In the flip-flop circuit shown in FIG. 8(A), each output terminal of two NAND gate circuits GT11 and GT12 is connected to one of input terminals of the other NAND gate circuit.

FIG. 9 shows a truth table representing an output signal state corresponding to the input signals of the two NAND gate circuits G11 and G12 constituting the flip-flop circuit. In FIG. 9, A1 and A2 denote the active bits to be stored in the memory circuit 10 corresponding to an input and imply that the output value of the flip-flop outputs the truth data of the corresponding NAND gate only when the active bit is "1".

In the case in which the flip-flop circuit shown in FIG. 8(A) is to be constituted by using the self-configuration circuit shown in FIG. 2, first of all, four input signals In0, In1, In2 and In3 are input from the address input terminal 41 to the self-configuration matrix 30 through the switch matrix 70. In addition, output data d1, A1, d2 and A2 of the truth table shown in FIG. 8 corresponding to a combination of the input signals are input from the data input/output terminal 42. Consequently, the output data d1, A1, d2 and A2 of the truth table are written to the predetermined address of the memory array 11 in the memory circuit 10 by using the input signals In0, In1, In2 and In3 as addresses. When the writing is completed, reading is carried out to decide whether or not the data are written normally. When a write error is made, address update is carried out to write the data to another address.

Next, in order to set a feedback loop of the flip-flop circuit to be constituted, status setting is carried out for a predetermined flip-flop (for example, FF1, FF2) in the data storage 60. More specifically, first of all, the input signals In2 and In3 are fixed to "0" respectively, and input signals In0 and In1 of the NAND gate circuit Gll are set to "0, 0", "1, 0", "0, 1" or "1, 1" according to data to be held in the flip-flop FF1 and are input through the address input terminal 41.

As shown in columns a, b, c and d of FIG. 9 respectively, then, if both of the input signals In2 and In3 are fixed to "0", "1" is read as an active bit A1 corresponding to the NAND gate circuit G1. Consequently, a clock CLK is supplied to the flip-flop FF1 through the AND gate G1 of the data storage 60. As a result, data d1 of "1" or "0" are fetched to the flip-flop FF1 depending on the combination of the input signals In0 and In1 at that time. In other words, the status of the flip-flop FF1 is set.

Next, the input signals In0 and In1 are fixed to "0" respectively, and input signals In2 and In3 of the NAND gate circuit G12 are set to "0, 0", "1, 0", "0, 1" or "1, 1" according to data expected to be held in the flip-flop FF2 and are input through the address input terminal 41.

As shown in columns a, e, i and m of FIG. 9 respectively, then, if the input signals In0 and In1 are both fixed to "0", "1" is read as an active bit A2 corresponding to the NAND gate circuit G2. Consequently, a clock CLK is supplied to the flip-flop FF2 through the AND gate G2 of the data storage 60. As a result, data d2 of "1" or "0" are fetched to the flip-flop FF2 depending on the combination of the input signals In2 and In3 at that time. In other words, the status of the flip-flop FF2 is set.

In the flip-flop comprising the two NAND gates shown in FIG. 8, respective output signals are fed back to one of the input terminals of the other NAND gate. Therefore, outputs Out0 and Out1 cannot be set to "0" at the same time. Accordingly, when the status of each of the flip-flops FF1 and FF2 in the data storage 60 is to be set, it is necessary to pay attention such that their holing states are not set to "0".

After each of the flip-flops FF1 and FF2 is set to a desirable status as described above, data stored in memory cells corresponding to the switches CSW31 and CSW32 surrounded by a dotted line in FIG. 3(A) which are provided in the control information RAM 74 in the switch matrix circuit 70 are rewritten and the switches are changed from the address input terminal 41 side to the output terminal side of the data storage 60. Consequently, the input signals In1 and In2 of the flip-flop shown in FIG. 8 are disabled. Instead, the outputs Out0 and Out1 of the NAND gates G11 and G12 are supplied as input signals (addresses) to the self-configuration matrix 30 in the next stage. In other words, a feedback loop of the flip-flop is thus constituted.

By using the self-configuration circuit according to the embodiment shown in FIG. 2, thus, corresponding logic function can be constituted in the self-configuration circuit 300 based on HDL description read from a file in which design data having the HDL description are stored.

FIG. 10 shows an example of a system constituting a logic circuit having desirable logic function in accordance with the HDL description by using the self-configuration circuit 300 according to the embodiment illustrated in FIG. 2.

In FIG. 10, the reference numeral 400 denotes a storage device (file) in which the design data having the HDL description shown in FIG. 8 are stored, and the reference numeral 500 denotes a control apparatus for forming and outputting a signal for decoding the HDL description stored in the file 400 and for constituting the corresponding logic function in the self-configuration circuit 300. The control apparatus 500 can be constituted by using a general-purpose microcomputer, for example.

Next, description will be given to the procedure for logically constituting a flip-flop circuit having such a structure as shown in FIG. 8 in accordance with the HDL description of the file 400 by using the self-configuration circuit 300 according to the embodiment illustrated in FIG. 2.

First of all, the control apparatus 500 comprising the general-purpose microcomputer and the like decodes the HDL description and recognizes that a configuration object is a flip-flop circuit, and generates the combination of the input signals In0, In1, In2 and In3 shown in the truth table of FIG. 9 as the address signals to be supplied to the self-configuration circuit 300, that is, "0, 0, 0, 0", "1, 0, 0, 0", "0, 1, 0, 0" . . . "1, 1, 1, 1", for example.

Then, the generated address signal is given to the address input terminal 41 of the self-configuration circuit 300. Correspondingly, the controller generates active bit data A1 and A2 corresponding to the data corresponding to the outputs d1 and d2 of the truth table as write data corresponding to the addresses and gives them to the data input/output terminal 42 in parallel with the input of the address signal to be sent to the self-configuration circuit 300 on a time basis.

In the self-configuration circuit 300, consequently, data are written to the memory circuit 10 in accordance with the procedure described with reference to the flow chart of FIG. 7. Accordingly, when the input signals In0 to In3 of the flip-flop circuit are input to the predetermined address input terminal 41 of the self-configuration circuit 300 after the writing is completed, corresponding data (output data bits d1 and d2 and active bits A1 and A2) stored in the memory circuit are read out. First of all, output data corresponding to the active bits A1 and A2 of "1" are fetched into the flip-flop FFi (i=1 to n) shown in FIG. 4. The data are supplied to the self-configuration matrix 30 through the switch matrix 60.

Consequently, next data are read from the memory circuit 10 according to previously read data, and signals equivalent to outputs Out0 and Out1 of the flip-flop circuit are output from the predetermined terminal of the data input/output terminal 42. Thus, when the self-configuration circuit according to the embodiment shown in FIG. 2 is used, the logic of the flip-flop can be constituted by writing data to the memory circuit 10 in accordance with the HDL description, so that desirable logic function including a sequential circuit can be implemented.

FIG. 11 shows a specific example of the interface circuit 200 using the TAP illustrated in FIG. 1.

As described above, the TAP is an interface and control circuit for a scan test and a BIST circuit which are defined by the IEEE 1149.1 standard. The TAP is constituted by a bypass register 211 to be used for shifting test data from an input port to an output port; a data register 212 to be used for transmitting a specific signal to the circuit; a device ID register 213 for setting a manufacturing identification number peculiar to a chip; an instruction register 214 to be used when a data register is to be selected and an internal test method is to be controlled; a controller 215 for controlling the whole TAP circuit; and the like.

The data register 212 is a register for option. Moreover, four required instructions and three option instructions are prepared for instructions set to the instruction register 214. A test mode select signal TMS, a test clock TCK and a reset signal TRST for specifying a test mode are input from three special external terminals to the controller 215. Based on these signals, a control signal is formed for the registers 211 to 214 and the selector circuits 216 to 218.

Moreover, the TAP is provided with an input terminal of test data TDI and an output terminal of test result data TDO, and the input test data TDI are supplied to each of the registers 211 to 214 or each of internal scan paths Iscan and Bscan through the selector circuit 216. Moreover, the contents of the registers 211 to 214 and scan out data transmitted from an internal circuit are output to the outside of a chip through the selector circuits 217 and 218. Furthermore, a signal for the internal BIST circuit is formed and supplied to the TAP in accordance with the contents of the data register 212 and the instruction register 214, and a signal indicative of a test result output from the BIST circuit can be output to the outside of the chip through the selector circuits 217 and 218.

In the system LSI according to the embodiment shown in FIG. 1, the self-configuration circuit 300 and the self-test circuit constituted on the CPU 120 are regarded as the BIST circuits as described later in detail, and a set signal and data for a self test to the self-configuration circuit 300 and the CPU 120 are input and a test result is output by utilizing the signal input/output function for the BIST circuit of the TAP 200.

In FIG. 11, "Iscan" implies a test path for diagnosing an internal logic circuit by using a shift register obtained by coupling a flip-flop constituting the internal logic circuit like a chain as a scan path of the test data. Moreover, "Bscan" implies a test path for diagnosing a connection state (a boundary scan test) with other semiconductor integrated circuits by using a shift register obtained by coupling a flip-flop provided in a signal input/output section (the interface circuit 180 in FIG. 1) like a chain as a scan path. The function for the scan test of the TAP 200 does not need to be used in the system LSI according to the embodiment of FIG. 1.

In the above-mentioned embodiment, thus, a test program is loaded into the structure of the test circuit or the chip through the TAP. Therefore, it is possible to implement a semiconductor integrated circuit device in which a test terminal may have several pins (4 to 5 pins). More specifically, the loading of the structure of the test circuit and the test program requires the mounting of an external system, a test program and a test pattern. In the present embodiment, however, it is possible to implement the loading by practically utilizing a protocol technically established as the TAP. The TAP is standardized and an instruction can be executed with a test terminal having 4 to 5 pins. Therefore, only a slight increase of the number of terminals is applicable in the application of the present embodiment so that the number of the pins of the LSI can be decreased.

Next, the procedure for a method of manufacturing the system LSI as an example of the semiconductor integrated circuit device shown in FIG. 1 will be described with reference to FIG. 12.

First of all, the self-configuration circuit 300 constituted in a part of the SRAM 130 is caused to configure an ALPG for generating a test pattern of a memory based on the HDL description (Step S101). Consequently, the SRAM 130 and another SRAM 140 are tested (Step S102). The results of the test for the SRAMs 130 and 140 are judged (Step S103). If the result is "fault", the product is regarded to be defective and a fail signal is generated (Step S104) and an external tester is caused to carry out recognition so that the test is ended.

On the other hand, if it is judged that the product is good as a result of the test of the SRAM 140, a test circuit for testing a logic circuit portion is constituted in the self-configuration circuit 300 based on the HDL description and a memory for storing the test pattern is constituted in the SRAM 140 judged to be good as a result of the test at the Step S102 (Step S105) and a test pattern is described thereon to check the user logic circuit 110 and the CPU 120 (Steps S106 and S107). If the result of the test is "bad", the product is regarded to be defective and a fail signal is generated (Step S104), and the external tester is caused to carry out recognition and the test is ended.

Furthermore, if it is judged that the product is good as a result of the test for the user logic circuit 110 and the CPU 120, the ALPG is constituted again in the self-configuration circuit 300 (Step S108) and a redundancy algorithm for the DRAMs 150 to 170 is loaded onto the CPU 120 (Step S109) and bit redundancy is carried out by the CPU while testing the DRAMs 150 to 170 through the ALPG (Step S110). At this time, the redundancy algorithm generated from a tester language may be described with the tester HDL without loading the redundancy algorithm onto the CPU 120 and may be constituted integrally with the ALPG in the self-configuration circuit 300 based on the HDL description.

If the result of the test for the DRAMs 150 to 170 is "fail" and "redundancy disable", the product is judged to be defective and a fail signal is generated (Step S104), and the external tester is caused to carry out recognition and the test is ended. On the other hand, if the result is "good", the self-configuration circuit 300 is reconstituted in an ordinary SRAM and is operated as a storage device for a system (Step S111). Since the fault is removed on a self-configuration basis in the self-configuration circuit 300, the test is not required.

By the above-mentioned method, a so-called "non over-head logic test circuit" in which a special circuit for a test does not need to be provided on a chip can be implemented, and furthermore, most of the structure of the self-configuration circuit 300 is originally similar to the structure of the SRAM. Therefore, a processing for the RAM has a slight over-head and this method can be implemented with a slight increase of the number of circuits.

According to the present embodiment, the self-configuration circuit 300 employs a technique in which a self-configuration matrix is provided in a prestage of an address decoder of an ordinary memory circuit, a comparator is provided on an output, predetermined addressing is carried out through an external system through the operation of the self-configuration matrix and the comparator, and an address in which a predetermined writing/reading operation cannot be carried out is replaced with another address by a change in the self-configuration matrix, thereby going around a fail address. Therefore, the fault is removed on the self-configuration basis. Then, the truth value of a desirable logic circuit is stored in the memory circuit 10 by setting the address of the self-configuration circuit 300 to be an input signal. Consequently, it is possible to configure a combination circuit for outputting a signal subjected to a predetermined logic for an input.

In the self-configuration circuit 300, furthermore, the switch matrix 70 capable of switching an input and a feedback signal is provided on the address input side and the data storage 60 is provided on the data output side to carry out a logic in time division. The result of a first logic held in the data storage 60 is fed back to an input through the switch matrix 70. Consequently, it is possible to implement a sequential circuit in which a logic value output from the memory circuit 10 depends on a previous status.

From the above description, it is apparent that the combination circuit and the sequential circuit can be constituted in the self-configuration circuit 300 in the present embodiment. Thus, a test circuit constituted by the tester HDL based on a virtual tester technical study is a general logic circuit and can be configured by the self-configuration circuit 300. In other words, it is possible to constitute a test circuit in such a form as to go around a fault by adding peripheral circuits such as the self-configuration matrix, the comparator, the switch matrix or the data storage to the ordinary SRAM. Moreover, the circuit to be added at this time has a smaller scale than the scale of a memory array. In particular, the data storage function or the like is usually contained in the SRAM having a pipeline structure which has often been employed in recent years. It is sufficient that a small scale circuit is simply changed by utilizing the data storage function.

It is also possible to implement these circuits constituted on a scribe line of a wafer in such a form that they are not present in an actual chip even if they are present on the wafer. Consequently, it is possible to eliminate the over-head of hardware. In general, a method of constituting a whole test circuit on a scribe line to facilitate a test has been known. However, a method of constituting a part of the test circuit to reduce the over-head has not been known.

Furthermore, the test circuit can be constituted on the self-configuration circuit 300 according to the embodiment with the tester HDL as described above and can be operated by the test program of the external tester. In other words, the test circuit is constituted by the above-mentioned method and procedure so that other circuits provided on a chip can be test and redundancy can be carried out. Finally, the self configuration circuit 300 is reconstituted as an ordinary SRAM so that the original function of a product chip can be implemented. Consequently, it is possible to remarkably reduce an over-head with the provision of the test circuit. In addition, the SRAM according to the present embodiment comprises the self-configuration matrix and is constituted to have fault avoiding function. Therefore, a test for the SRAM itself is not required and a test circuit for another circuit can be constituted in the self-configuration circuit 300. Thus, the whole product chip can be facilitated.

In the present embodiment, the self-configuration matrix 30 is provided such that the fault of the memory array 11 constituting the self-configuration circuit 300 can be automatically avoided to constitute a logic. If a chip having a fault on the memory array is to be excluded as a defective product, it is not necessary to provide the self-configuration matrix 30 and the comparator 20. In that case, a signal may be directly supplied from the switch matrix circuit 70 to the address decoder 12 of the memory circuit 10, and the sense amplifier 13 and the data storage 60 may be connected directly to each other.

Next, a second embodiment of the present invention will be described with reference to FIGS. 13 to 20. FIG. 13 shows the whole structure of a system LSI to which the second embodiment of the present invention is applied. In FIG. 13, the same circuit blocks as those of FIG. 1 have the same reference numerals and repetitive description will be omitted.

The system LSI is different from the system LSI in FIG. 1 in that several SRAMs are not provided on one semiconductor chip but several ten to several hundred SRAMs are provided thereon and that the SRAM shown in FIG. 13 is not provided with a self-configuration matrix and a comparator but a switch matrix is simply added to an ordinary SRAM. The SRAM according to the embodiment includes a circuit for temporarily storing data having several ten to several hundred bits which is referred to as a register file or a register set.

FIG. 14 shows an example of the structure of the SRAM provided on the semiconductor chip and their connection relationship.

In the present embodiment, a plurality of wiring groups ABL1 to ABL5 constituting an address bus in a vertical direction and a plurality of wiring groups DBL1 to DBL5 constituting a data bus in a transverse direction are provided to form a grid, which is not particularly restricted. A memory circuit 10 and a switch matrix 70 are provided in a portion corresponding to a cross of each grid, the memory circuit 10 including a memory array 11, an address decoder 12, a sense amplifier 13 and a data register 16 which constitute an ordinary SRAM. The data register 16 is not a data storage circuit shown in FIG. 4 but may be an ordinary register capable of simply holding data which is also used in a general SRAM.

In the present embodiment, the output of the sense amplifier 13 is fed back to the switch matrix 70. Moreover, a switch matrix circuit 310 capable of selectively connecting signal lines is provided in a crossing portion of the vertical wiring groups ABL1 to ABL5 and the transverse wiring groups DBL1 to DBL5. Furthermore, there are provided a switch matrix circuit 320 for selectively connecting the address input terminal of each SRAM to the signal lines of the vertical wiring groups ABL1 to ABL5 and a switch matrix circuit 330 for selectively connecting the data input/output terminal of each SRAM to the signal lines of the transverse wiring groups DBL1 to DBL5. The switch matrix circuits 310, 320 and 330 have the structure shown in FIG. 3 in the same manner as the switch matrix circuit 70 in the SRAM.

Thus, the vertical wiring groups ABL1 to ABL5 constituting the address bus and the transverse wiring groups DBL1 to DBL5 constituting the data bus can be connected to each other through the switch matrix circuit 310 provided in the crossing portions thereof. Therefore, it is possible to optionally connect the SRAMs constituted to have an optional logic. Consequently, a logic integrated circuit having desirable logic function and a larger scale can be constituted in accordance with the HDL description.

Next, the way of constituting a NAND gate circuit and a flip-flop will be described as an example in order to prove that an optional logic can be configured by the SRAM including the memory circuit 10 and the switch matrix circuit 70 shown in FIG. 14.

FIG. 15(A) shows a logic symbol of the NAND gate circuit, FIG. 15(B) shows a value to be stored in the memory array 11 in the case in which the NAND gate circuit is to be implemented by the memory circuit, and FIG. 15(C) shows the relationship between input signals A0 and A1 and an address of a memory array to be selected thereby.

In the case in which the NAND gate circuit is to be implemented by the SRAM shown in FIG. 14, a processing of previously writing data is carried out to store data "1" in zero, first and second addresses of the memory array 11 respectively and to store data "0" in a third address as shown in FIG. 15(B). Thus, when "0, 0", "1, 0", "0, 1" and "1, 1" are input as the address signals A0 and A1 to the SRAM, "1", "1", "1" and "0" are output respectively as shown in FIG. 15(C). It is apparent that FIG. 15(C) represents the truth table of the NAND gate circuit in FIG. 15(A). In other words, the NAND gate circuit is constituted by the SRAM.

Similarly, if data "0" are stored in the zero, first and second addresses of the memory array 11 respectively and data "1" are stored in the third address, the NAND gate circuit can be implemented. If the data "0" are stored in the zero address of the memory array 11 and the data "1" are stored in the first, second and third addresses respectively, the OR gate circuit can be implemented. Thus, it is possible to constitute an optional 2-input logic through the SRAM by changing data to be stored in the memory array 11. Furthermore, it is possible to implement an optional 3-input logic through the SRAM by storing predetermined data to zero to seventh addresses corresponding to the address signals A0 to A2.

FIG. 16(A) shows a logic symbol of a D type flip-flop circuit, FIG. 16(B) shows a value to be stored in the memory array 11 in the case in which the flip-flop circuit is to be implemented by the memory circuit, and FIG. 16(C) shows an equivalent circuit of the FIG. 16(B). Moreover, FIG. 17 shows the relationship between the input signals AO, A1 and A2 in the case in which the flip-flop is constituted by the SRAM and the address of a memory array selected thereby, and FIG. 18 shows a timing of an input/output signal during the latch operation of the flip-flop circuit illustrated in FIG. 16. In FIG. 16(C), DLY denotes a delay element which is equivalent to a delay on a feedback path from the sense amplifier 13 to the switch matrix circuit 70. When a delay time from the decoder 12 of the memory circuit to the output of the sense amplifier 13 is very short (for example, when it is smaller than a shift of the address signals A0 and A1), the delay element may be positively provided on the feedback path to adjust a timing, thereby preventing a malfunction.

In the present embodiment, in the case in which the flip-flop circuit is to be implemented by the SRAM, the processing of writing data is previously carried out to store the data "0" in the zero, first, second and fifth addresses of the memory array 11 respectively and to store the data "1" in the third, fourth, sixth and seventh addresses respectively as shown in FIG. 17. In such a state, when the address signals A0 and A1 are input to the SRAM in the timing as shown in FIG. 18, data in the corresponding addresses are read out in response to a feedback signal A2 of data D0 read from the memory array 11 and the address signals A0 and A1. It is apparent that FIG. 17 represents the truth table of the flip-flop circuit shown in FIG. 16(A). In other words, the flip-flop circuit can be constituted by the SRAM.

Similarly, the inverted data of the stored data are stored in a first column of the memory array 11 so that the a flip-flop for outputting an inverted output/Q can be constituted, and the inverted data of the data in the first column are stored in a second column of the memory array 11 so that a flip-flop for outputting the inverted output/Q together with a non-inverted output Q can be constituted. Furthermore, it is also possible to increase an address signal, thereby implementing a flip-flop with a set terminal or a flip-flip with a reset terminal.

FIG. 19 shows a specific example of the memory array 11 constituting the SRAM. As shown in FIG. 19, the memory array 11 includes a plurality of parallel.word lines WL1, WL2 . . . , a plurality of complementary data line pairs DL1, /DL1 DL2, /DL2 . . . in a direction almost orthogonal to the word lines, and a plurality of memory cells MC provided on each of intersecting points of the word lines WL1, WL2 . . . and the complementary data line pairs DL1, /DL1 ; DL2, /DL2 . . . The memory cell MC is constituted by sixth elements, which are not particularly restricted, four MOS-FETs Q1, Q2, Q3 and Q4 constituting two inverters having input terminals and output terminals which intersect and are connected to each other, and a pair of selecting MOSFETs Q45 and Q6 having a source—drain connected between the output terminals of the inverters and the complementary data lines DL and /DL and a gate connected to the word line.

Next, the procedure for a method of manufacturing the system SLI shown in FIG. 13 will be described with reference to FIG. 20.

First of all, an ALPG for generating a test pattern for testing another SRAM by using a part of SRAMs 130 on an LSI chip is constituted based on the HDL description (Step S101). Consequently, another SRAM 130 is tested (Step S102). The results of the test for the SRAM 130 is judged (Step S103). If the result is "fault", the product is regarded to be defective and a fail signal is generated (Step S104) and an external tester is caused to carry out recognition so that the test is ended.

On the other hand, if it is judged that the product is good as a result of the test of the SRAM 130, a test circuit for testing a logic circuit portion by using a part of the SRAMs and other SRAMs is constituted based on the HDL description and a memory for storing the test pattern is constituted in the SRAM 130 judged to be good as a result of the test at the Step S102 (Step S105) and a test pattern is described thereon to check a user logic circuit 110 and a CPU 120 (Steps S106 and S107). If the result of the test is "bad", the product is regarded to be defective and a fail signal is generated (Step S104), and the external tester is caused to carry out recognition and the test is ended.

Furthermore, if it is judged that the product is good as a result of the test for the user logic circuit 110 and the CPU 120, the ALPG for generating a test pattern for a DRAM on a part of the SRAMs is constituted (Step S108) and a fail memory for storing the result of the test is constituted by using other SRAMs (Step S108a). Then, a redundancy algorithm for the DRAM 150 is loaded onto the CPU 120 (Step S109) and bit redundancy is carried out by the CPU while testing the DRAM 150 through the ALPG (Step S110).

If the result of the test for the DRAM 150 is "fail" and "redundancy disable", the product is judged to be defective and a fail signal is generated (Step S104), and the external tester is caused to carry out recognition and the test is ended. On the other hand, if it is judged that the product is "good" as the result of the test, the SRAM constituting the test circuit is reconstituted into an ordinary SRAM and is operated as a storage device for a system (Step S111).

By the above-mentioned method, a so-called "non over-head logic test circuit" can be implemented, in which a special circuit for a test does not need to be provided on a chip, and furthermore, most of the structure of the SRAM constituting the test circuit is originally similar to the structure of the SRAM. Therefore, a processing for the RAM has a slight over-head and this method can be implemented with a slight increase of the number of circuits.

While the system LSI has been taken as an example for the about description, the present invention can also applied to the case in which the system shown in FIG. 13 is constituted on one printed board by a plurality of LSIs, consequently, the same effects can be obtained.

While the invention made by the present inventors have been specifically described based on the embodiments, the present invention is not restricted to the above-mentioned embodiments but it is apparent that various changes can be made without departing from the scope of the invention. For example, the SRAM having a self-configuration circuit structure as in the above-mentioned embodiments is not always utilized as a portion for simply constituting the test circuit but can be practically used as a portion for implementing the function for carrying out a emulation on a product chip.

Moreover, while the SRAM has been used as the memory of a self-configuration type has been used in the above-mentioned embodiments, it is also possible to use a non-volatile memory such as a flash memory. Furthermore, although the self-configuration circuit 300 has been provided in a part of the SRAM 130 in the above-mentioned embodiments, the whole SRAM 130 can also be set to be the SRAM of a self-configuration type. Furthermore, when the SRAM 130 has a structure in which the address decoder thereof can be divided, that is, is to be operated as a memory, it is selectively operated in response to a 20-bit address signal, for example. When the SRAM 130 is to be operated as a logic circuit, it can be constituted to output a logical output value in response to a signal having 2 bits or several bits in 20 bits.

While the case in which the invention made by the present inventors is applied to the system LSI in the applicable field which is the background has mainly been described above, the present invention is not restricted thereto but can be widely utilized for a semiconductor integrated circuit having a memory circuit (including a Register) provided therein.

The effects obtained by the typical invention disclosed in the present application will be simply described as follows.

According to the present invention, in the semiconductor integrated circuit device comprising the storage circuit such as an SRAM, the test circuit can be constituted in the SRAM to test other circuits, and the same SRAM can be operated as an ordinary SRAM after the test. Therefore, it is possible to implement a semiconductor integrated circuit device having less over-head of hardware with the mounting of the test circuit. In other words, an SRAM of a self-configuration type to be mounted on a chip can be implemented with a slight improvement in the structure as compared with the ordinary SRAM, and the over-head is very small and the operation of the SRAM is not inhibited. Consequently, after the test of a product chip is ended, the SRAM can be operated for the same product and the test circuit does not finally remain on the chip. Thus, it is possible to implement a semiconductor integrated circuit device having less over-head for the test circuit.

In the present invention, moreover, the test circuit can be constituted in an SRAM to be a storage circuit of a self-configuration type based on the HDL description. Therefore, the test circuit can easily be constructed in the chip by using a computer. In addition, a test program to be used in an ordinary tester is available and debug for the test circuit is not required. Therefore, it is possible to implement the semiconductor integrated circuit device capable of considerably reducing the steps of a test design.

Furthermore, the self-configuration matrix to be the variable address circuit is provided in the SRAM of a self-configuration type constituting the test circuit is provided so that a circuit can be configured in such a form as to go around fails. Therefore, it is possible to implement a semiconductor integrated circuit device having high durability against faults.

What is claimed is:

1. A method of manufacturing a semiconductor integrated circuit device comprising a logic circuit, and a plurality of first storage circuits and a second storage circuit acting as a storage circuit capable of constituting an optional logic for the semiconductor integrated circuit device; said second storage circuit including a memory array capable of reading and writing data from a memory cell specified by an address signal; an address decoder to decode the address signal and to generate a signal to select a memory cell in the memory array; a feedback path to feed back data read from the memory array to an input side of the address decoder; a switch matrix capable of switching an input address signal or a signal fed back through the feedback path so as to supply the switched signal to the address decoder; and a memory to store control information of each switch in the switch matrix; comprising the steps of:

constituting, on said second storage circuit, a test circuit to check said first storage circuits and/or said logic circuit;

testing said first storage circuits and/or the logic circuit by the test circuit; and reconstituting said second storage circuit after the test for said first storage circuits and/or the logic circuit is completed.

2. The method of manufacturing a semiconductor integrated circuit device according to claim 1, wherein, at the testing step to be carried out by the test circuit, a result of the test obtained by the test circuit is stored in one of said first storage circuits.

3. The method of manufacturing a semiconductor integrated circuit device according to claim 1, further comprising a redundancy processing step of replacing a fail memory cell in said memory array detected at the test step with a spare memory cell after completing the test of one of the first storage circuits in a case in which the first storage circuit includes a redundant circuit for replacing the fail memory cell with the spare memory cell.

4. The method of manufacturing a semiconductor integrated circuit device according to claim 1, wherein at the step of constituting a test circuit on said second storage circuit, design data having a function level described in a hardware description language are decoded by control means, and a signal for determining a logical structure of the second storage circuit is given from the control means to the second storage circuit so that a logic circuit having a desirable logic function is constituted.

* * * * *